(12) United States Patent
Chu et al.

(10) Patent No.: US 12,245,432 B2
(45) Date of Patent: Mar. 4, 2025

(54) MEMORY DEVICE AND MANUFACTURING METHOD THEREOF

(71) Applicant: Taiwan Semiconductor Manufacturing Company, Ltd., Hsinchu (TW)

(72) Inventors: Feng-Ching Chu, Pingtung County (TW); Feng-Cheng Yang, Zhudong Township (TW); Katherine H. Chiang, New Taipei (TW); Chung-Te Lin, Tainan (TW); Chieh-Fang Chen, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/446,582

(22) Filed: Aug. 9, 2023

(65) Prior Publication Data

US 2023/0389320 A1    Nov. 30, 2023

Related U.S. Application Data

(62) Division of application No. 17/246,987, filed on May 3, 2021, now Pat. No. 11,937,426.

(60) Provisional application No. 63/135,131, filed on Jan. 8, 2021.

(51) Int. Cl.
| | |
|---|---|
| *H10B 43/27* | (2023.01) |
| *H10B 41/10* | (2023.01) |
| *H10B 41/27* | (2023.01) |
| *H10B 43/10* | (2023.01) |

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
None
See application file for complete search history.

(56) References Cited

U.S. PATENT DOCUMENTS

| | | |
|---|---|---|
| 6,251,737 B1 | 6/2001 | Lee |
| 10,381,376 B1 | 8/2019 | Nishikawa et al. |
| 2004/0061153 A1 | 4/2004 | Misewich et al. |

(Continued)

FOREIGN PATENT DOCUMENTS

| | | | | |
|---|---|---|---|---|
| CN | 106972020 A | * | 7/2017 | ........ H01L 27/11521 |
| CN | 111200015 A | * | 5/2020 | |

OTHER PUBLICATIONS

Non-Final Office Action dated Aug. 9, 2023 for U.S. Appl. No. 17/246,987.

(Continued)

*Primary Examiner* — Evren Seven
*Assistant Examiner* — Cole Leon Lindsey
(74) *Attorney, Agent, or Firm* — Eschweiler & Potashnik, LLC

(57) ABSTRACT

The present disclosure provides a semiconductor structure and a method for forming a semiconductor structure. The semiconductor structure includes a substrate, and a dielectric stack over the substrate. The dielectric stack includes a first layer over the substrate and a second layer over the first layer. The semiconductor structure further includes a gate layer including a first portion traversing the second layer and a second portion extending between the first layer and the second layer.

20 Claims, 24 Drawing Sheets

(56) References Cited

U.S. PATENT DOCUMENTS

| | | | |
|---|---|---|---|
| 2005/0287759 A1* | 12/2005 | Wang | H01L 21/823412 |
| | | | 257/E21.654 |
| 2006/0278916 A1 | 12/2006 | Ilno et al. | |
| 2016/0126292 A1 | 5/2016 | Yanagida et al. | |
| 2016/0300885 A1 | 10/2016 | Konevecki et al. | |
| 2016/0322368 A1 | 11/2016 | Sun et al. | |
| 2017/0148517 A1 | 5/2017 | Harari | |
| 2018/0019254 A1* | 1/2018 | Jhang | H10B 43/27 |
| 2019/0207009 A1 | 7/2019 | Yamaguchi | |

OTHER PUBLICATIONS

Notice of Allowance dated Nov. 27, 2023 for U.S. Appl. No. 17/246,987.

* cited by examiner

MEMORY DEVICE AND MANUFACTURING METHOD THEREOF

REFERENCE TO RELATED APPLICATIONS

This application is a Divisional of U.S. application Ser. No. 17/246,987, filed on May 3, 2021, which claims the benefit of U.S. Provisional Application No. 63/135,131, filed on Jan. 8, 2021. The contents of the above-referenced patent applications are hereby incorporated by reference in their entirety.

BACKGROUND

The integrated circuit (IC) manufacturing industry has experienced exponential growth over the past decades. In the course of IC evolution, functional density (i.e., the number of interconnected devices per chip area) has generally increased while geometric size (i.e., the smallest component or line that can be created using a fabrication process) has decreased.

However, since feature sizes continue to decrease, fabrication processes continue to become more difficult to perform and the critical dimension uniformity of components (or lines) continues to become more difficult to control. For example, complicated operations may require more photomasks, thereby incurring high cost and thereby deteriorating throughput.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B' illustrates a partially enlarged fragmentary diagrammatic view of portion X of the semiconductor device of FIG. 1A, according to some other embodiments of the present disclosure.

FIG. 1B" illustrates a partially enlarged fragmentary diagrammatic view of portion X of the semiconductor device of FIG. 1A, according to yet some other embodiments of the present disclosure.

DETAILED DESCRIPTION

Figure 1A:
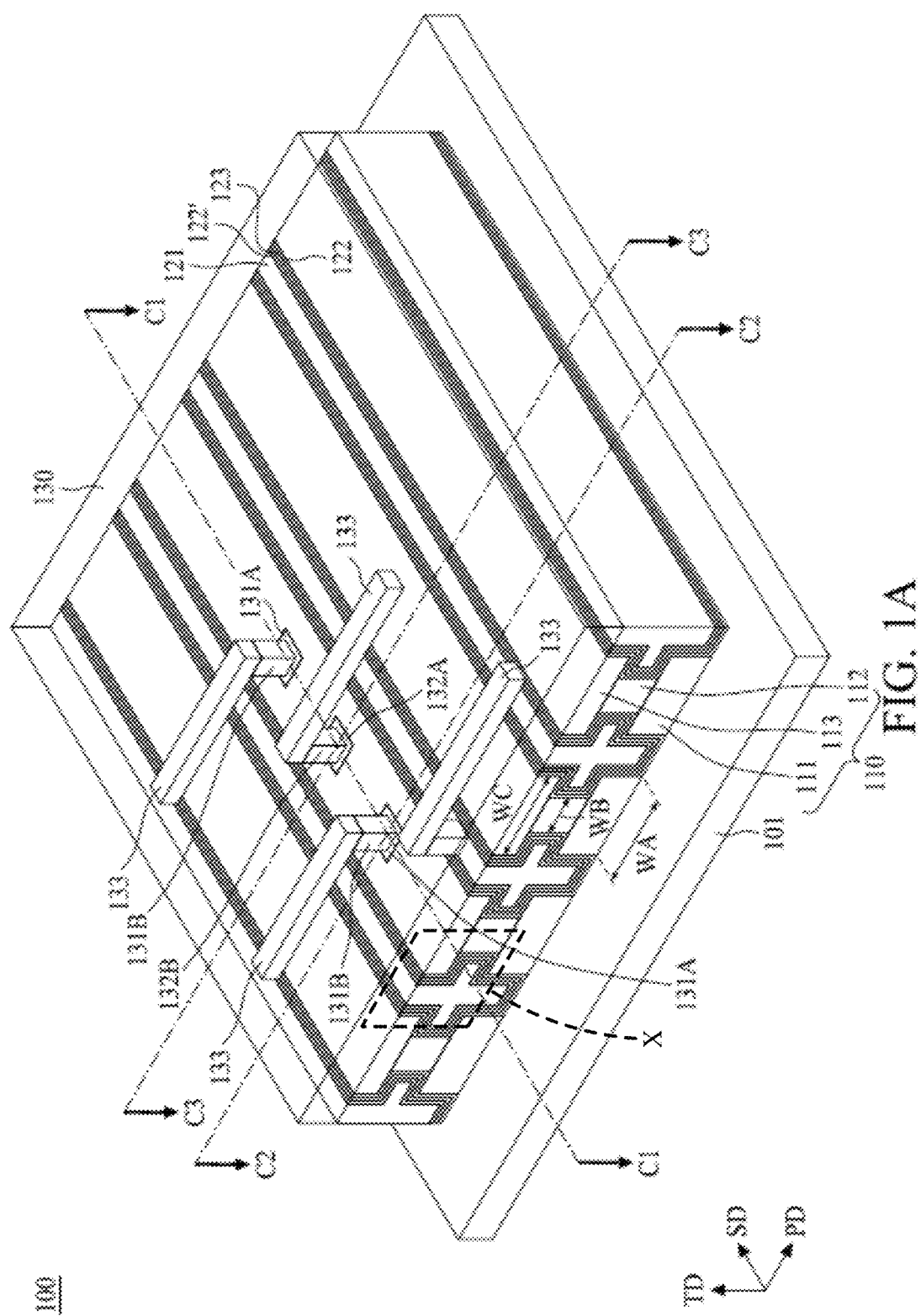
FIG. 1A is a schematic drawing illustrating a perspective view of a semiconductor structure, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Memory devices are widely used in various applications, including data storage, data transmission, networking, computing, et cetera. For advanced applications, such as 5th generation (5G) mobile networks or artificial intelligence, memory devices with higher speed, higher device density, lower latency, and higher bandwidth are in demand. However, the trend of scaling down the geometry size of semiconductor devices faces the challenge of complicated fabrication operations (such as complicated lithography operations, which depend on a lot of photomasks) and the costs incurred therefrom.

The present disclosure provides a semiconductor structure and a method for fabricating the semiconductor structure to address the aforementioned issues. For example, fabrication may be simplified and the amount of lithography stages may be reduced compared to other methods. Furthermore, by increasing device channel area, the speed and/or the device performance may be improved.

Figure 1B:
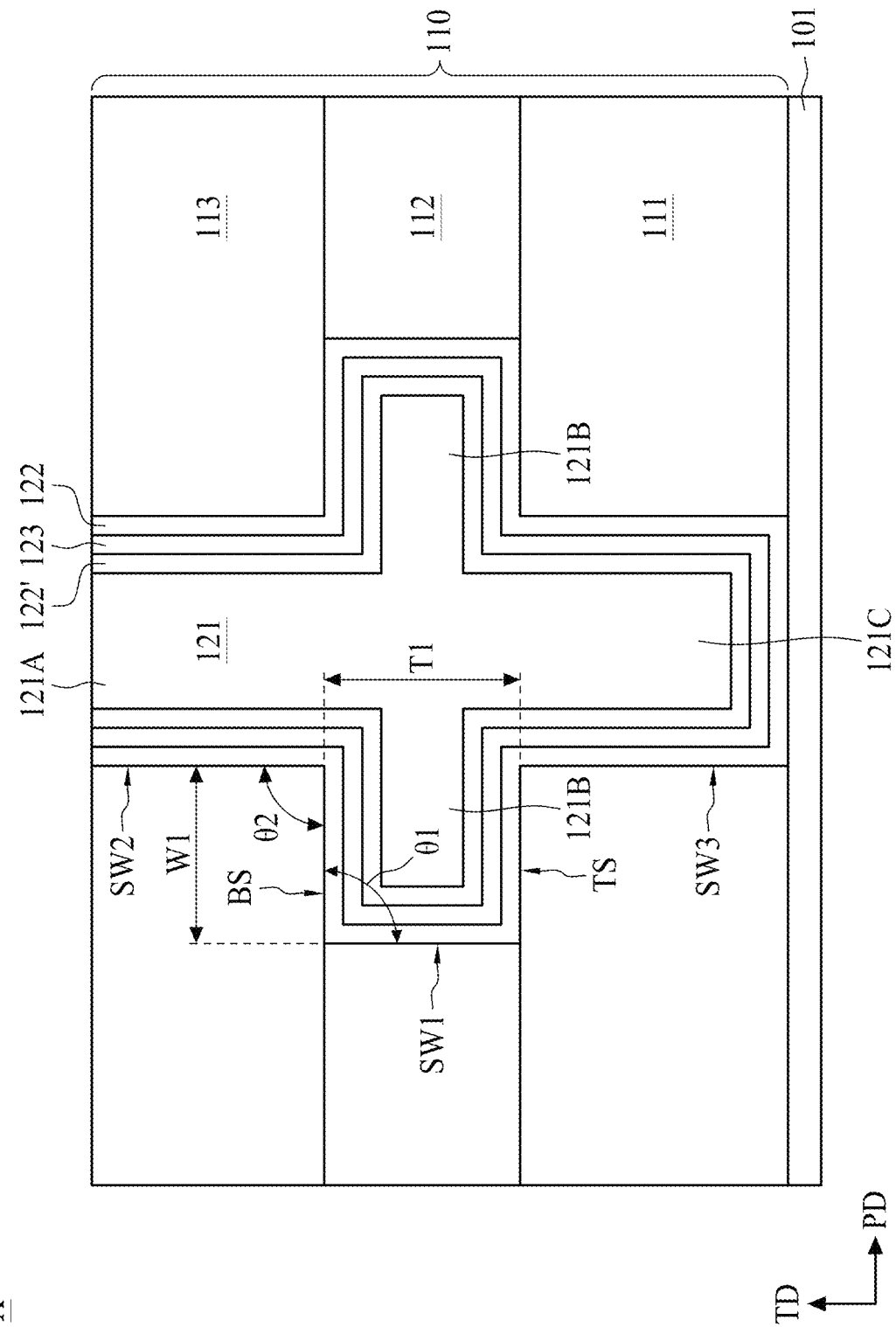
FIG. 1B illustrates a partially enlarged fragmentary diagrammatic view of portion X of the semiconductor device of FIG. 1A, according to some embodiments of the present disclosure.
Figure 1B:
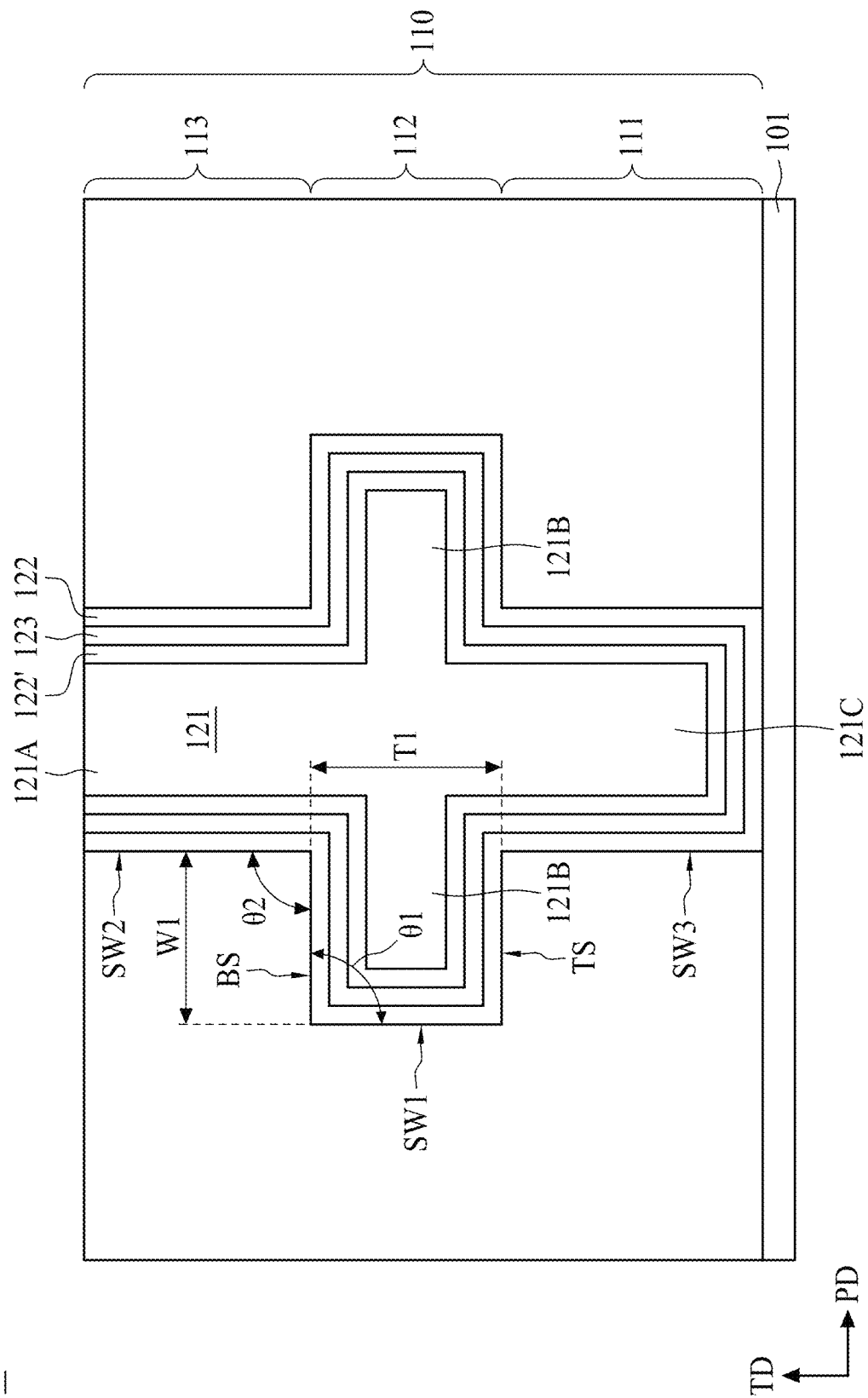
Figure 1B:
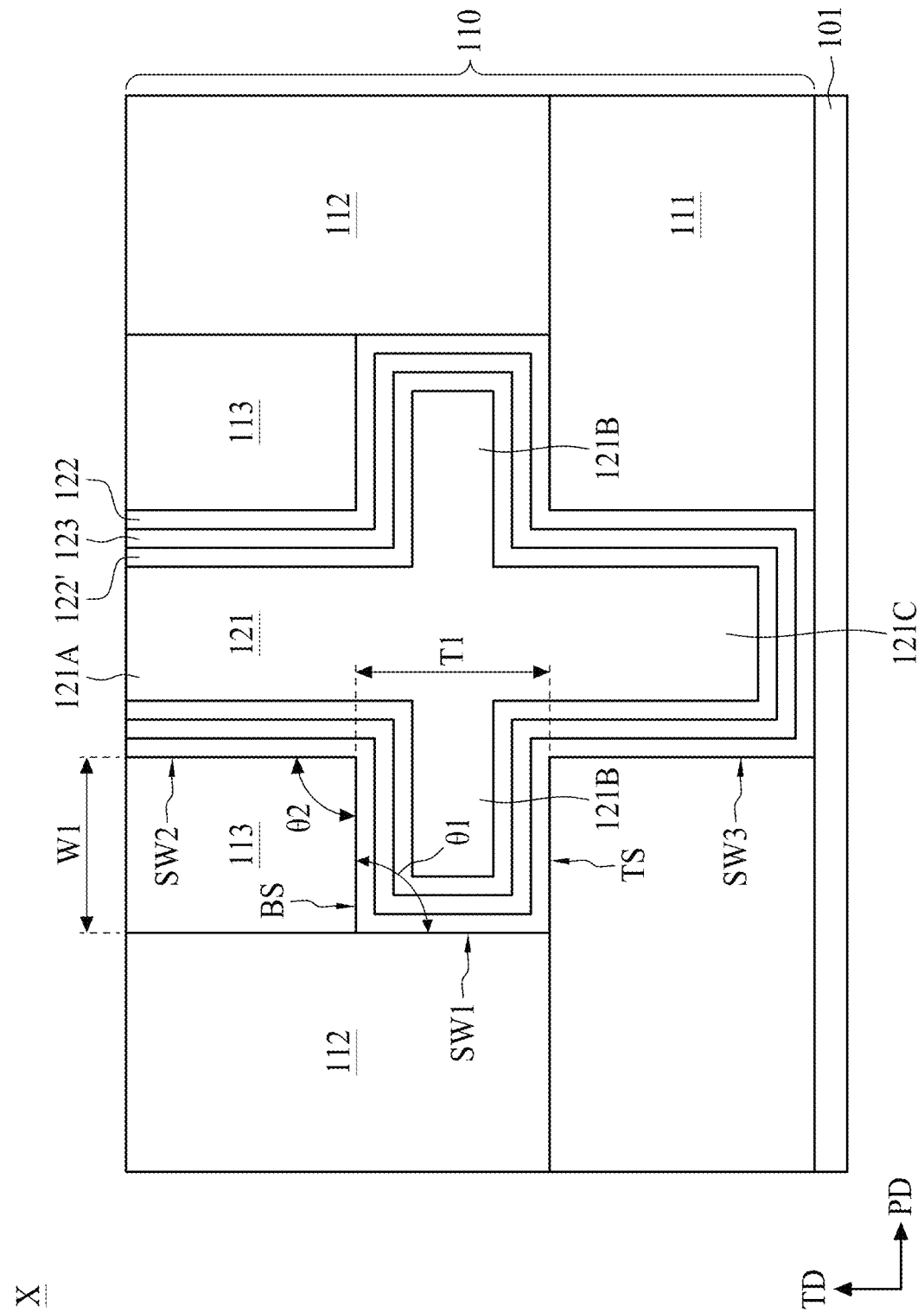

Referring to FIG. 1A and FIG. 1B, FIG. 1A is a schematic drawing illustrating a perspective view of a semiconductor structure, and FIG. 1B illustrates a partially enlarged fragmentary diagrammatic view of portion X of the semiconductor device of FIG. 1A, according to some embodiments of the present disclosure. A semiconductor device 100 may include a substrate 101, a dielectric stack 110 over the substrate 101, a gate layer 121 in the dielectric stack 110, and conductive features 131A and 132A in the dielectric stack 110. In some embodiments, the substrate 101 includes silicon. Alternatively or additionally, the substrate 101 includes: another material, such as germanium, silicon carbide, gallium arsenide, gallium phosphide, indium phosphide, indium arsenide, and/or indium antimonide; an alloy semiconductor, such as silicon germanium (SiGe), gallium arsenide phosphide (GaAsP), aluminium indium arsenide (AlInAs), aluminium gallium arsenide (AlGaAs), indium gallium arsenide (GaInAs), indium gallium phosphide (GaInP), and/or gallium indium arsenide phosphide (GaInAsP); or combinations thereof. In some other embodiments, the substrate 101 includes one or more group III-V materials, one or more group II-IV materials, or combinations thereof. In some alternative embodiments, the substrate 101 may be undoped. In some other embodiments, the substrate 101 is a semiconductor-on-insulator substrate, such as a silicon-on-insulator (SOI) substrate, a silicon germanium-on-insulator (SGOI) substrate, or a germanium-on-insulator (GOI) substrate. In some other embodiments, the substrate 101 may include active regions.

The dielectric stack 110 may include insulation material. In some of the embodiments, the dielectric stack 110 may include dielectric materials having several portions formed in different stages. In some of the embodiments, the dielectric stack 110 may include a multi-layer composition, for example, a first layer 111, a second layer 113 over the first layer 111, and a spacer layer 112 having a portion between the first layer 111 and the second layer 113. In some of the embodiments, the first layer 111 and the second layer 113 may include oxide. In some embodiments, a material of the first layer 111 may be similar to a material of the second layer 113. In some embodiments, a material of the spacer layer 112 may include oxide-based material. In some cases, the material of the spacer layer 112 may be similar or substantially identical to the material of the first layer 111 or the second layer 113. In some alternative embodiments, a material of the spacer layer 112 may be different from the first layer 111 and/or the second layer 113. For example, the material of the spacer layer 112 may include other oxide-based material, silicon nitride (SiN), silicon germanium (SiGe), or other insulation material/film material.

Referring to FIG. 1B', FIG. 1B' illustrates a partially enlarged fragmentary diagrammatic view of portion X of the semiconductor device of FIG. 1A, according to some embodiments of the present disclosure. Some alternative embodiments shown in FIG. 1B' are similar to the discussion in FIG. 1B, but a difference resides in that the material of the spacer layer 112 is identical to the material of the first layer 111 and the second layer 113. For example, the same material (such as oxide-based material) is utilized as material of the first layer 111 and the second layer 113 (as will be discussed in FIG. 3) and for filling into the spaces between two adjacent gate layers 121 (as will be discussed in FIG. 8 to FIG. 9). In the case of the material of the spacer layer 112 being identical with the first layer 111 and the second layer 113, the layers thereof may be formed at different stages, which is subsequently discussed in FIG. 2 to FIG. 12. In some of the embodiments, the material of the first layer 111, the second layer 113, and the spacer layer 112 may be merged or integrated.

Referring to FIG. 1B", FIG. 1B" illustrates a partially enlarged fragmentary diagrammatic view of portion X of the semiconductor device of FIG. 1A, according to some embodiments of the present disclosure. Some alternative embodiments shown in FIG. 1B" are similar to the discussion in FIG. 1B or FIG. 1B', but a difference resides in that the material of the spacer layer 112 is different from the material of the first layer 111 and the second layer 113, wherein a portion of the spacer layer 112 is uncovered by the second layer 113. In some embodiments, a material of the spacer layer 112 may include oxide-based material. In some cases, the material of the spacer layer 112 may be similar to the material of the first layer 111 or the second layer 113. In some alternative embodiments, a material of the spacer layer 112 may be different from the first layer 111 and/or the second layer 113. For example, the material of the spacer layer 112 may include other oxide-based material, silicon nitride (SiN), silicon germanium (SiGe), or other insulation material/film material.

Referring to FIG. 1A, in some embodiments, a width WB of the spacer layer 112 along the primary direction PD may be less than a width WA of the first layer 111 or the width WC of the second layer 113.

The semiconductor device 100 may include multiple gate layers 121 spaced in a primary direction PD. The gate layers 121 may include conductive material, such as Tungsten (W), or the like. The gate layers 121 may have a cruciform/cross shape in a cross-sectional view (as shown in FIG. 1A, FIG. 1B, FIG. 1B', or FIG. 1B"), and each of the gate layers 121 extends along a secondary direction SD substantially perpendicular to the primary direction PD.

Referring to FIG. 1B, FIG. 1B', and FIG. 1B", a gate layer 121 may include a first portion 121A traversing the second layer 113, a second portion 121B extending between the first layer 111 and the second layer 113, and a third portion 121C in the first layer 111 and proximal to the substrate 101. The second portion 121B may be overlapping with the first layer 111 and the second layer 113 from a top view perspective (along a tertiary direction TD). In some embodiments, the first portion 121A of the gate layer 121 may be exposed from the dielectric stack 110.

The semiconductor device 100 may further include a first high-k material 122, a channel layer 123, and a second high-k material 122' between the gate layer 121 and the dielectric stack 110. The second high-k material 122' conforms to an outer profile of an outer sidewall and a bottom surface of the gate layer 121. The channel layer 123 conforms to an outer profile of the second high-k material 122'. The first high-k material 122 conforms to an outer profile of the channel layer 123. Alternatively stated, the channel layer 123 is between the first high-k material 122 and the second high-k material 122'. The first high-k material 122, the channel layer 123, and the second high-k material 122' extends along the secondary direction SD.

The first high-k material 122 may include material suitable for use as a dipole layer, such as, for example, hafnium-zirconium oxide (HfZrO; e.g., $Hf_x Zr_x O_y$, or the like), other hafnium-zirconium-based materials, or ferroelectric materials. The first high-k material 122 may act as a dipole layer for changing a channel memory status. The second high-k material 122' may include a material different from the first high-k material 122, such as, for example, hafnium oxide (e.g., HfO) or other materials suitable for enhancing channel carrier performance. For example, HfO may provide oxide vacancy for enhancing channel carrier performance.

The first high-k material 122 may be in direct contact with a bottom surface BS of the second layer 113, a top surface TS of the first layer 111, and a sidewall SW1 of the spacer layer 112. In some embodiments, a width W1 measured from a sidewall of the first high-k material 122 adjacent to the sidewall SW1 of the spacer layer 112 to a sidewall SW2 of the spacer layer 112 proximal to the first portion 121A of the gate layer 121 (or a sidewall SW3 of the spacer layer 112 proximal to the third portion 121C of the gate layer 121) may be in a range from about 30 nm to 90 nm. In the cases of having a width less than the aforementioned range, the device performance may be less than desired due to reduced device channel area. In the cases of having a width greater than the aforementioned range, the difficulty of controlling related operations (e.g., a lateral pullback operation as will be discussed in FIG. 4) may be undesirably increased. In some embodiments, a depth T1 measured from a surface of the first high-k material 122 adjacent to the bottom surface BS of the second layer 113 to another surface of the first high-k material 122 adjacent to the top surface TS of the first layer 111 may be in a range from about 50 nm to 80 nm. In the cases of having a depth less than the aforementioned range, the device performance may be less than desired due to reduced device channel area, or the difficulty of forming the gate layer 121 may be increased. In the cases of having a depth greater than the aforementioned range, the entire height of the semiconductor device 100 along the tertiary direction TD may be too large and thereby it may be difficult to comply with device size scale-down requirements.

By this configuration, the second portion 121B of the gate layer 121 may have a substantial vertical sidewall and constitute a profile similar to a quadrilateral, rectangular, or square profile in a cross-sectional view (as shown in FIG. 1B, FIG. 1B' or FIG. 1B"). Thereby the device channel area can be increased compared to a comparative embodiment having a curved profile, thus improving device performance (such as processing speed). In some embodiments, a first angle θ1 between a sidewall of the spacer layer 112 and the bottom surface BS of the second layer 113 may be in a range from about 80 degrees to about 90 degrees. Similarly, a second angle θ2 between sidewall SW2 of the second layer 113 proximal to the first portion 121A of the gate layer 121 and the bottom surface BS of the second layer 113 may be in a range from about 80 degrees to about degrees. In the cases of the angle being greater than or less than the aforementioned range, a defect may occur, formation of the first high-k material 122, the channel layer 123, and the second high-k material 122' may be difficult, or the device channel region may be too small.

Figure 1C:
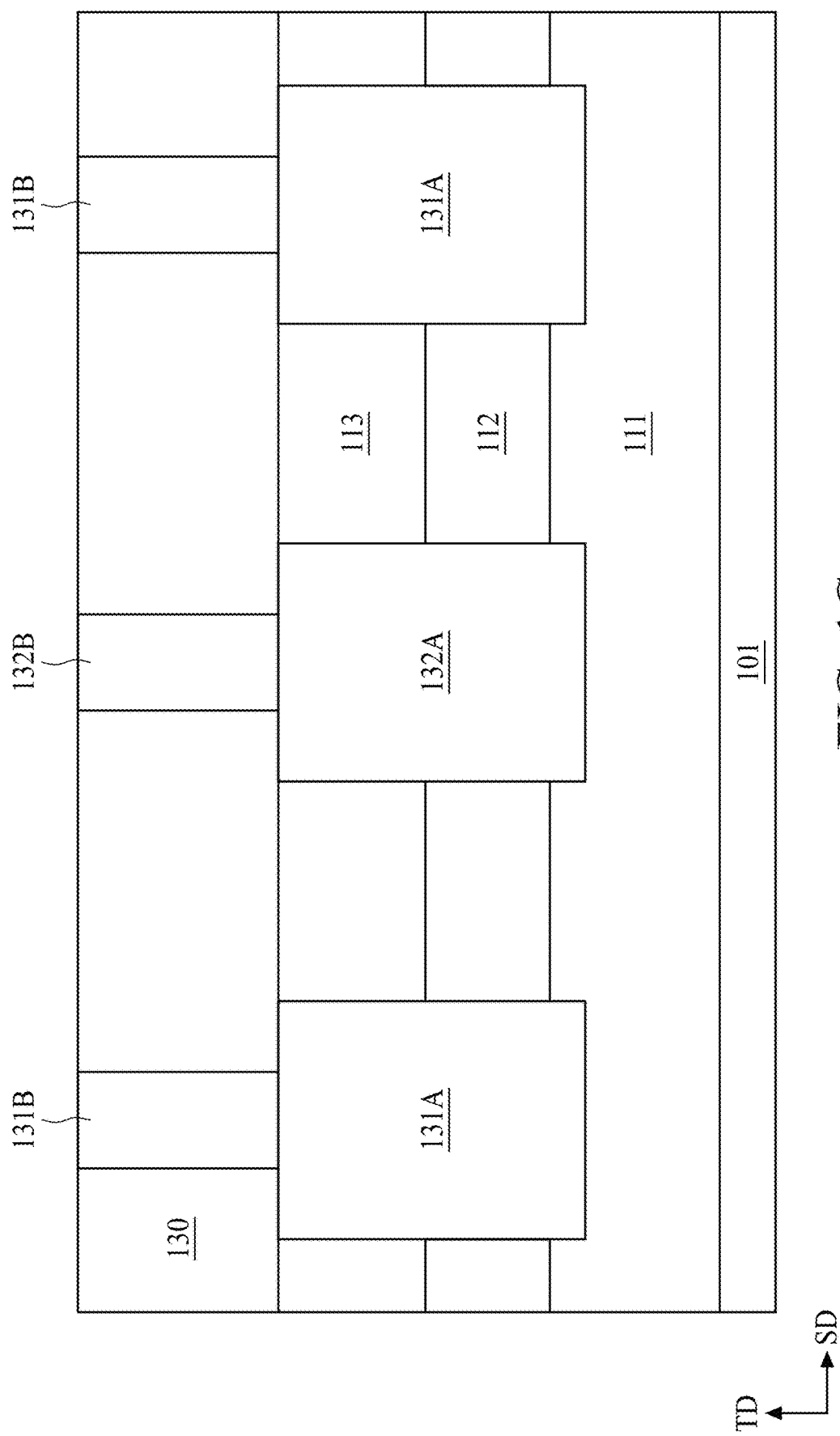
FIG. 1C illustrates a cross-sectional view of the reference cross-section C1-C1 of the semiconductor device of FIG. 1A, according to some embodiments of the present disclosure.
Figure 1D:
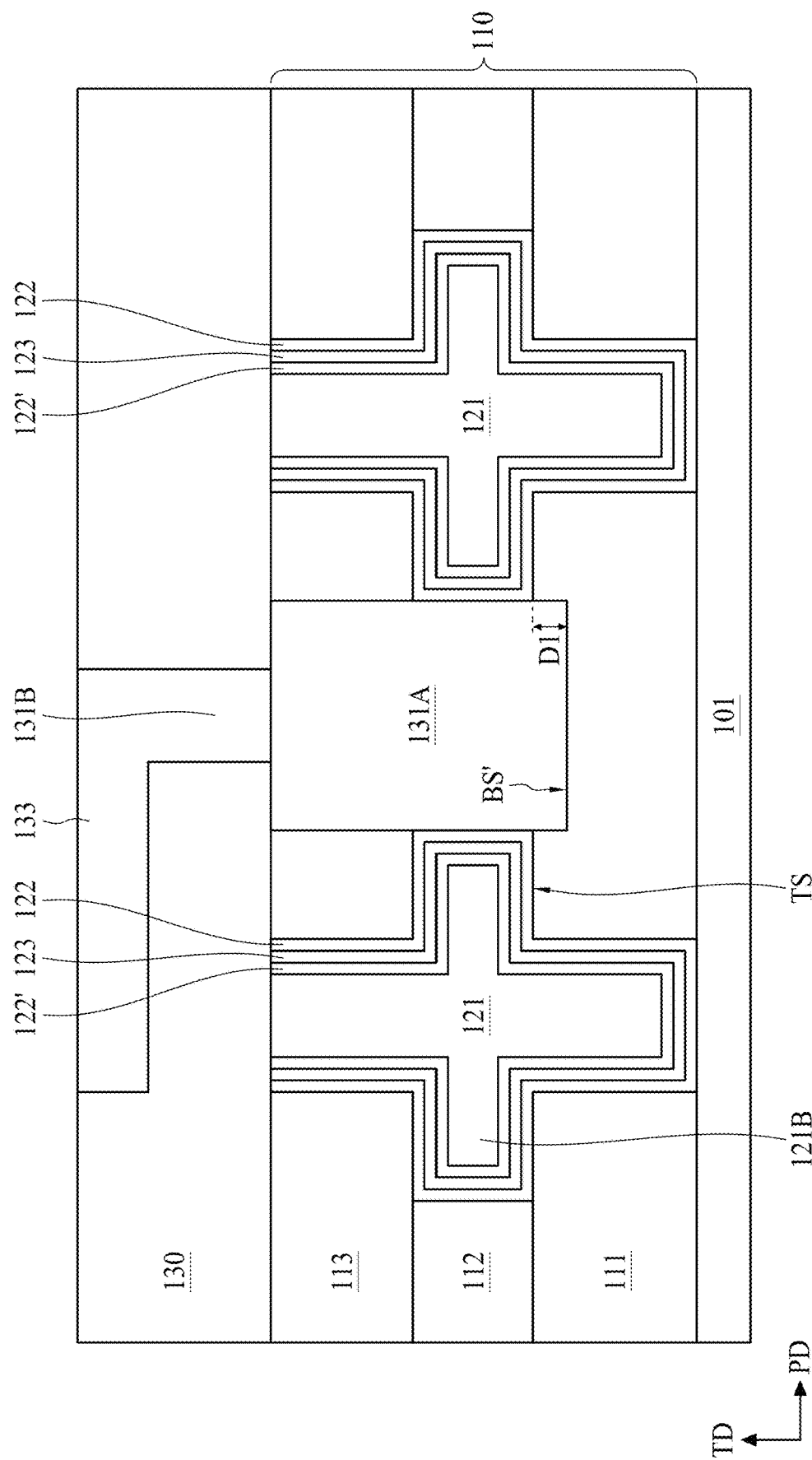
FIG. 1D illustrates a cross-sectional view of the reference cross-section C2-C2 of the semiconductor device of FIG. 1A, according to some embodiments of the present disclosure.
Figure 1E:
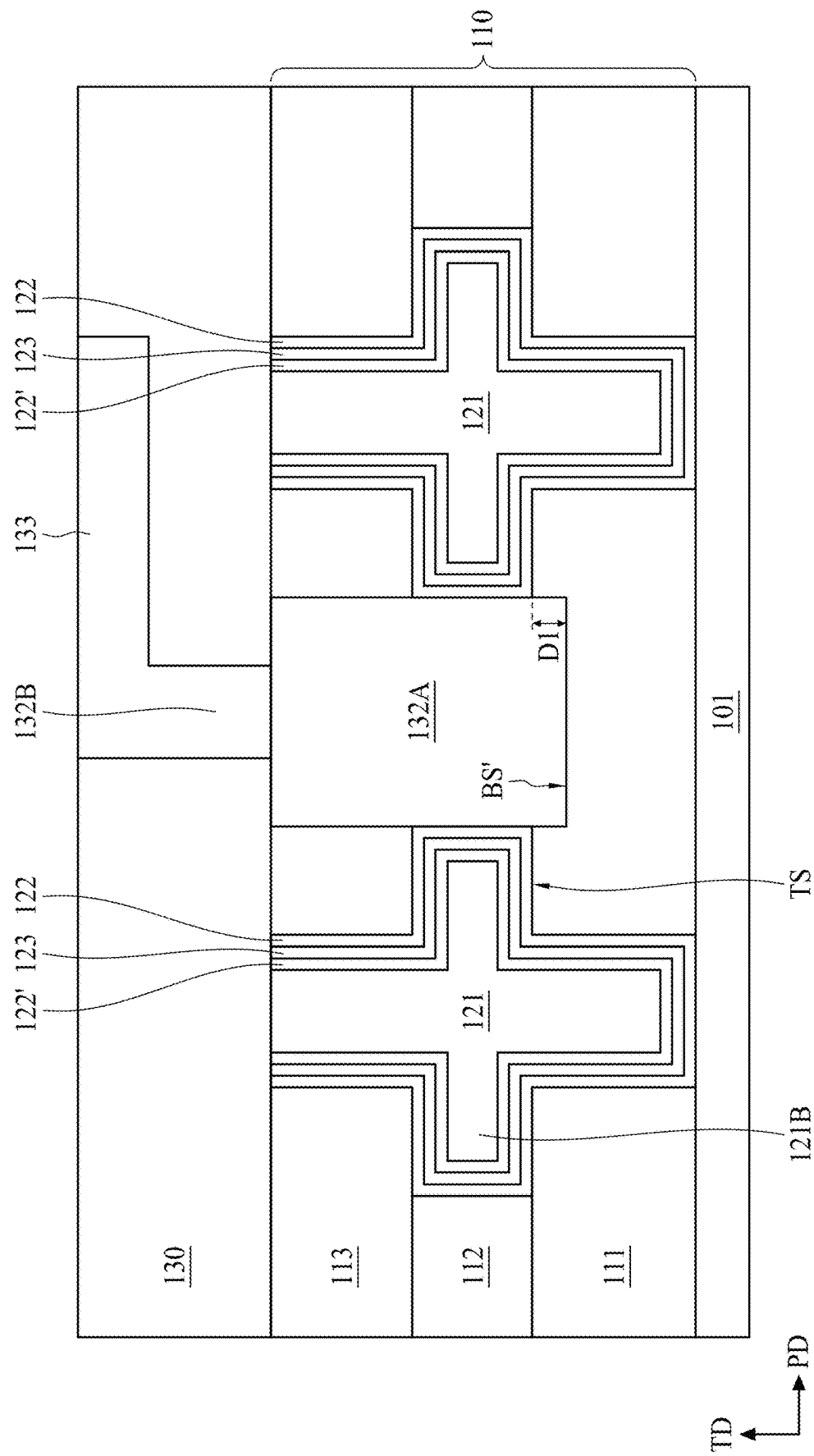
FIG. 1E illustrates a cross-sectional view of the reference cross-section C3-C3 of the semiconductor device of FIG. 1A, according to some embodiments of the present disclosure.

Referring to FIG. 1A, FIG. 1C, FIG. 1D and FIG. 1E, FIG. 1C illustrates a cross-sectional view of the reference cross-section C1-C1 of the semiconductor device of FIG. 1A, FIG. 1D illustrates a cross-sectional view of the reference cross-section C2-C2 of the semiconductor device of FIG. 1A, and FIG. 1E illustrates a cross-sectional view of the reference cross-section C3-C3 of the semiconductor device of FIG. 1A, according to some embodiments of the present disclosure. The semiconductor device 100 may further include conductive features 131A and 132A embedded in the dielectric stack 110 and between a pair of gate layers 121. The conductive features 131A and 132A traverse the second layer 113 and the spacer layer 112. In some embodiments, the conductive feature(s) 131A may constitute source layer(s) and the conductive feature(s) 132A may constitute drain layer(s). In some embodiments, the conductive features 131A and 132A may include conductive materials, such as tungsten (W) or the like. It should be noted that although only two conductive features 131A and one conductive feature 132A are shown in FIG. 1A and FIG. 1C, the present disclosure is not limited thereto. The semiconductor device 100 may include multiple rows of conductive features 131A and 132A between other pairs of gate layers 121 or may have one or more conductive features 131A and 132A between two gate layers 121.

As shown in FIG. 1D or FIG. 1E, a bottom surface BS' of the conductive features 131A (or the conductive features 132A) is at a level lower than a level of the top surface TS of the first layer 111. In some embodiments, a portion of the conductive features 131A and 132A may be laterally surrounded by the first layer 111. For example, a depth Dl measured from the bottom surface BS' of the conductive features 131A (or the conductive features 132A) to the surface of the first high-k material 122 adjacent to the top surface TS of the first layer 111 may be in a range from about 20 nm to about 30 nm. Such a configuration may increase the contact area between the first high-k material 122 and the conductive features 131A (or the conductive features 132A). In the cases of the depth Dl being less than 20 nm or the top surface TS of the first layer 111 being above the bottom surface BS' of the conductive features 131A (or the conductive features 132A), the entire contact area between the first high-k material 122 and the conductive features 131A (or the conductive features 132A) may be decreased, the etching operation may be difficult to control, or reliability may be affected. In the cases of the depth Dl being greater than 30 nm, the reliability (such as a property of the first layer 111) may be affected.

The semiconductor device 100 further includes an insulation layer 130 over the dielectric stack 110, and interconnect structures disposed in the dielectric stack 110. The interconnect structures may include a first conductive via 131B electrically connected to each of the conductive feature 131A and a second conductive via 132B electrically connected to each of the conductive feature 131A. In some embodiments, the semiconductor device 100 further includes a conductive path 133 disposed in the insulation layer 130 and connected to the gate layer 121. In some embodiments, the conductive path 133 constitute a word line. In some embodiments, the first conductive via 131B, the second conductive via 132B, and the conductive path 133 may include conductive material, such as copper.

Figure 2:
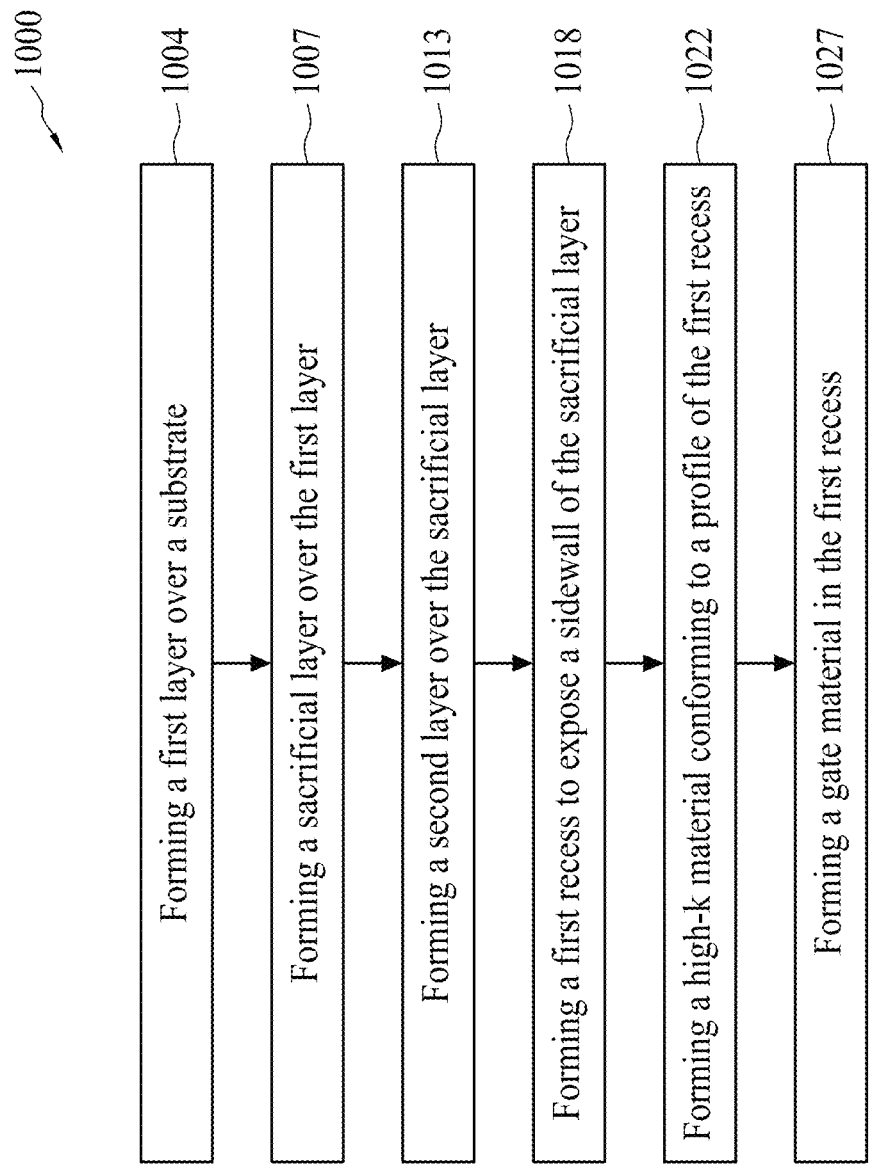
FIG. 2 shows a flow chart of a method for fabricating a semiconductor structure, in accordance with some embodiments of the present disclosure.

Referring to FIG. 2, FIG. 2 shows a flow chart of a method for fabricating a semiconductor structure, in accordance with some embodiments of the present disclosure. The method 1000 for fabricating a semiconductor device includes forming a first layer over a substrate (operation 1004, see, for example, FIG. 3), forming a sacrificial layer over the first layer (operation 1007, see, for example, FIG. 3), forming a second layer over the sacrificial layer (operation 1013, see, for example, FIG. 3), forming a first recess to expose a sidewall of the sacrificial layer (operation 1018, see, for example, FIG. 4), forming a high-k material conforming to a profile of the first recess (operation 1022, see, for example, FIG. 5), and forming a gate material in the first recess (operation 1027, see, for example, FIG. 6).

Figure 3:
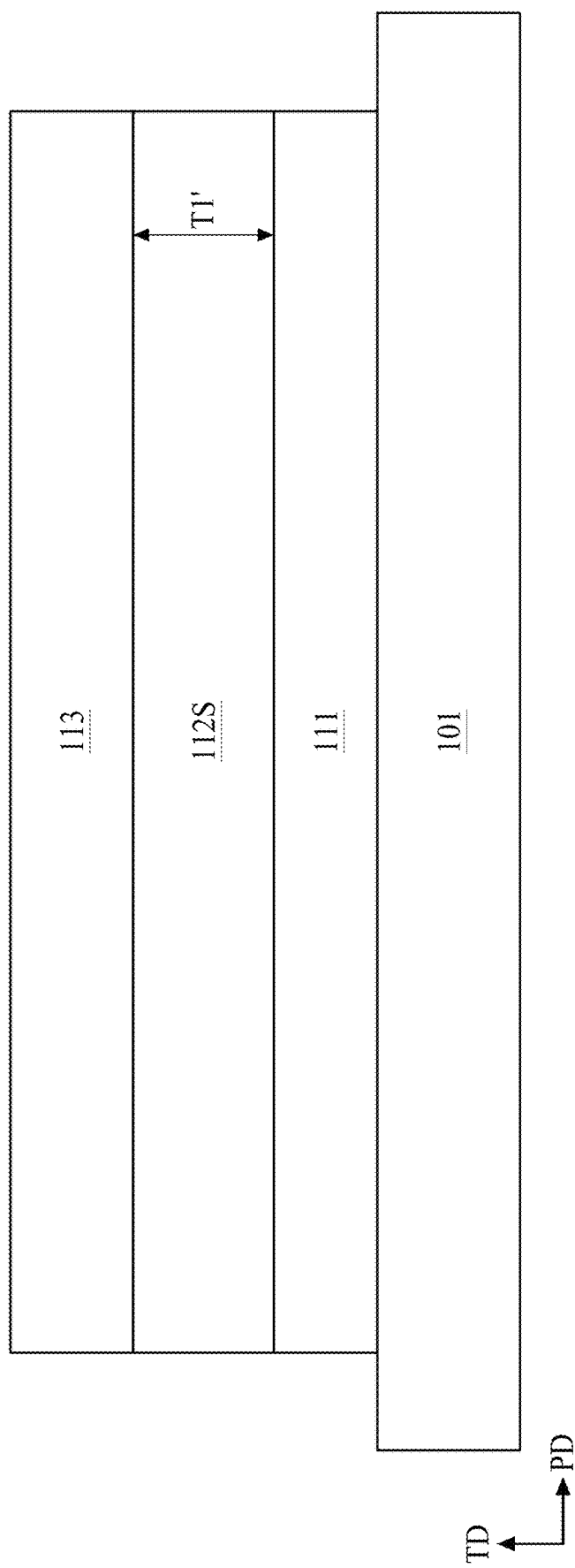
FIG. 3 to FIG. 9 are cross sectional views of a semiconductor structure during intermediate stages of manufacturing operations, according to some embodiments of the present disclosure.

Referring to FIG. 3, FIG. 3 is a cross sectional view of a semiconductor structure during intermediate stages of manufacturing operations, according to some embodiments of the present disclosure. A substrate 101 is provided. The details with regard to the substrate 101 can be referred to FIG. 1A. A first layer 111 is formed over the substrate 101, wherein the first layer 111 may include an insulation material. In some embodiments, the first layer 111 may include oxide-based material or other suitable material. A sacrificial layer 112S is formed over the first layer 111, wherein a material of the sacrificial layer 112S is different from the material of the first layer 111. For example, the sacrificial layer 112S may include thin film materials such as silicon nitride (SiN), silicon germanium (SiGe), or the like. A second layer 113 is formed over the sacrificial layer 112S, wherein a material of the second layer 113 is different from the material of the sacrificial layer 112S. In some embodiments, a material of the second layer 113 may be identical to or similar to the material of the first layer 111, such as oxide-based material or other suitable insulation material.

Figure 4:
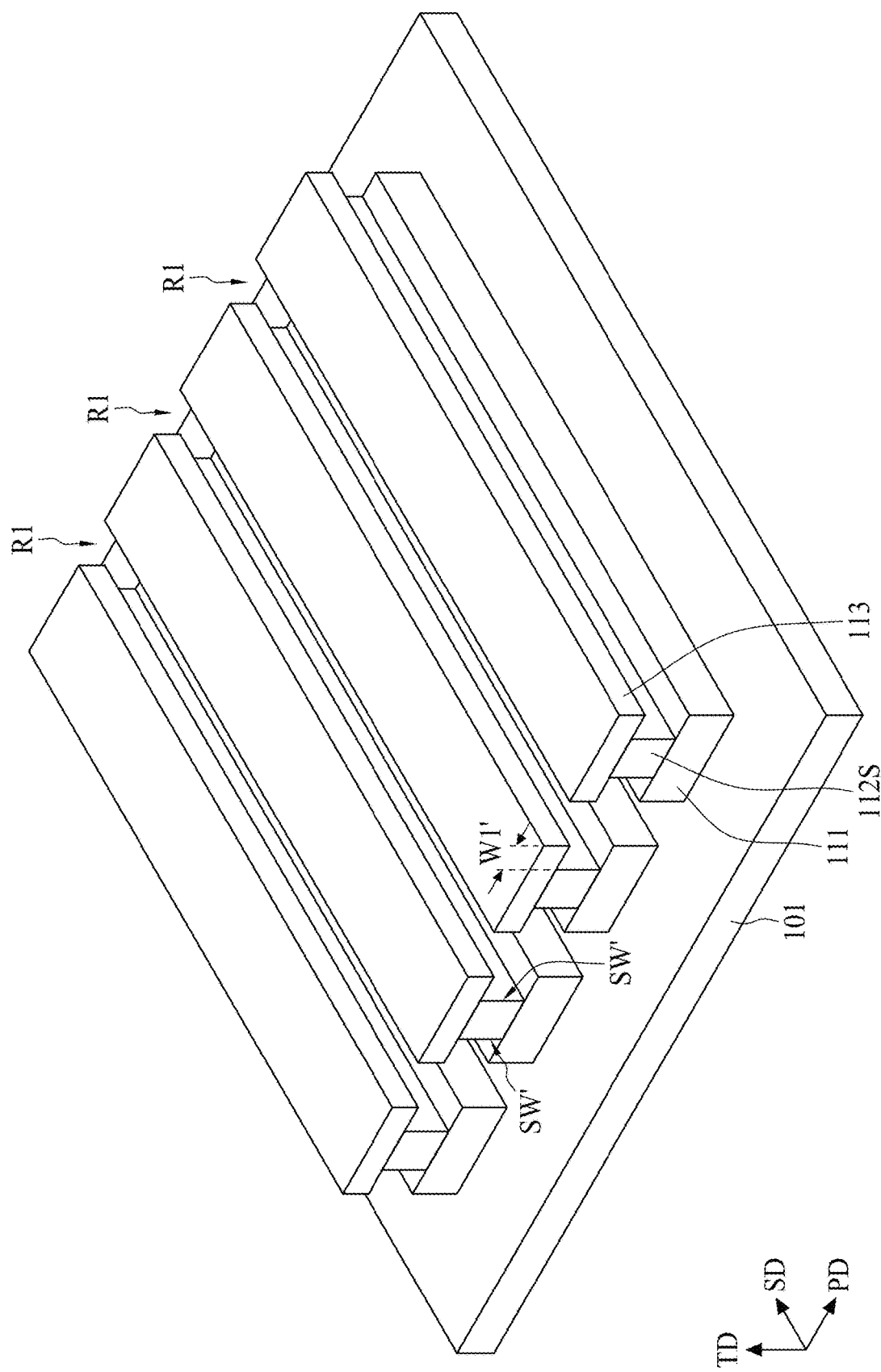

Referring to FIG. 4, FIG. 4 is a cross sectional view of a semiconductor structure during intermediate stages of manufacturing operations, according to some embodiments of the present disclosure. A cutting operation, which may include an etching operation and a photolithography operation, is performed to remove a portion of the first layer 111, the sacrificial layer 112S, and the second layer 113 and to thereby form a plurality of first recesses R1. In alternative embodiments, only one first recess R1 is formed. A sidewall of the sacrificial layer 112S is exposed at a sidewall of each of the first recesses R1. In some embodiments, a portion of the substrate 101 is exposed after the etching operation and the photolithography operation. In some embodiments, the etching operation may be an anisotropic etching operation. In some embodiments, the photolithography operation may include utilizing a photomask.

A lateral pullback operation for removing a portion of the sacrificial layer 112S is performed to expand each of the first recesses R1. In some embodiments, a portion of the sacrificial layer 112S is removed from the sidewall at a first recess R1 by a selective etching operation, which may include applying suitable a chemical over the substrate 101. For example, in the cases of having silicon nitride as a material of the sacrificial layer 112S, phosphoric acid (H 3 PO 4) with an elevated temperature (for example, around 170° C.) or another suitable chemical can be applied over the substrate 101 to laterally remove a portion of the sacrificial layer 112S. For another example, in the cases of having silicon germanium as a material of the sacrificial layer 112S, fluorine gas (F 2) or another suitable chemical can be applied over the substrate 101 to laterally remove a portion of the sacrificial layer 112S. The amount of sacrificial layer 112S being removed in the lateral pullback operation may be controlled by a time calculation.

By utilizing the lateral pullback operation, a portion of a bottom surface of the second layer 113 and a portion of a top surface of the first layer 111 may be exposed and uncovered by the sacrificial layer 112S. In addition, the remaining sacrificial layer 112S may have substantially vertical sidewall SW' after the lateral pullback operation, and the first recesses R1 may have a cruciform/cross shape from a cross-sectional view. Similar to the discussion in FIG. 1A to FIG. 1E, a lateral etching depth W1' of the lateral pullback operation may be in a range from about 30 nm to 90 nm. In the cases of having a lateral etching depth less than the aforementioned range, the device performance may be less than desired due to a reduced device channel area. In the cases of having a lateral etching depth greater than the aforementioned range, the difficulty of controlling a related operation may be undesirably increased, or, in some cases, defects may occur due to over-etching.

Referring to FIG. 3 and FIG. 4, a thickness T1' of the sacrificial layer 112S may be in a range from about 50 nm to 80 nm. In the cases of having a thickness less than the aforementioned range, the device performance may be less than desired due to a reduced device channel area, or the difficulty of the lateral pullback operation may be increased due to a higher aspect ratio. In the cases of having a thickness greater than the aforementioned range, the entire height of the semiconductor device along the tertiary direction TD may be too large and thereby it may be difficult to comply with device size scale-down requirements.

Furthermore, the angle at a corner of the second layer 113 (corresponding to the second angle θ2 shown in FIG. 1B, FIG. 1B', or FIG. 1B") may be in a range from about 80 degrees to about 90 degrees. Further, the angle at a corner between the sidewall SW' of remaining sacrificial layer 112S and the exposed bottom surface of the second layer 113 (corresponding to the first angle θ1 shown in FIG. 1B, FIG. 1B', or FIG. 1B") may be in a range from about 80 degrees to about 90 degrees. In the cases of either angle being greater than or less than the aforementioned ranges, defects may occur, the subsequent formation of the first high-k material 122, the channel layer 123, and the second high-k material 122' may be difficult (as will be discussed in FIG. 5 to FIG. 6), or the device channel region may be too small.

Figure 5:
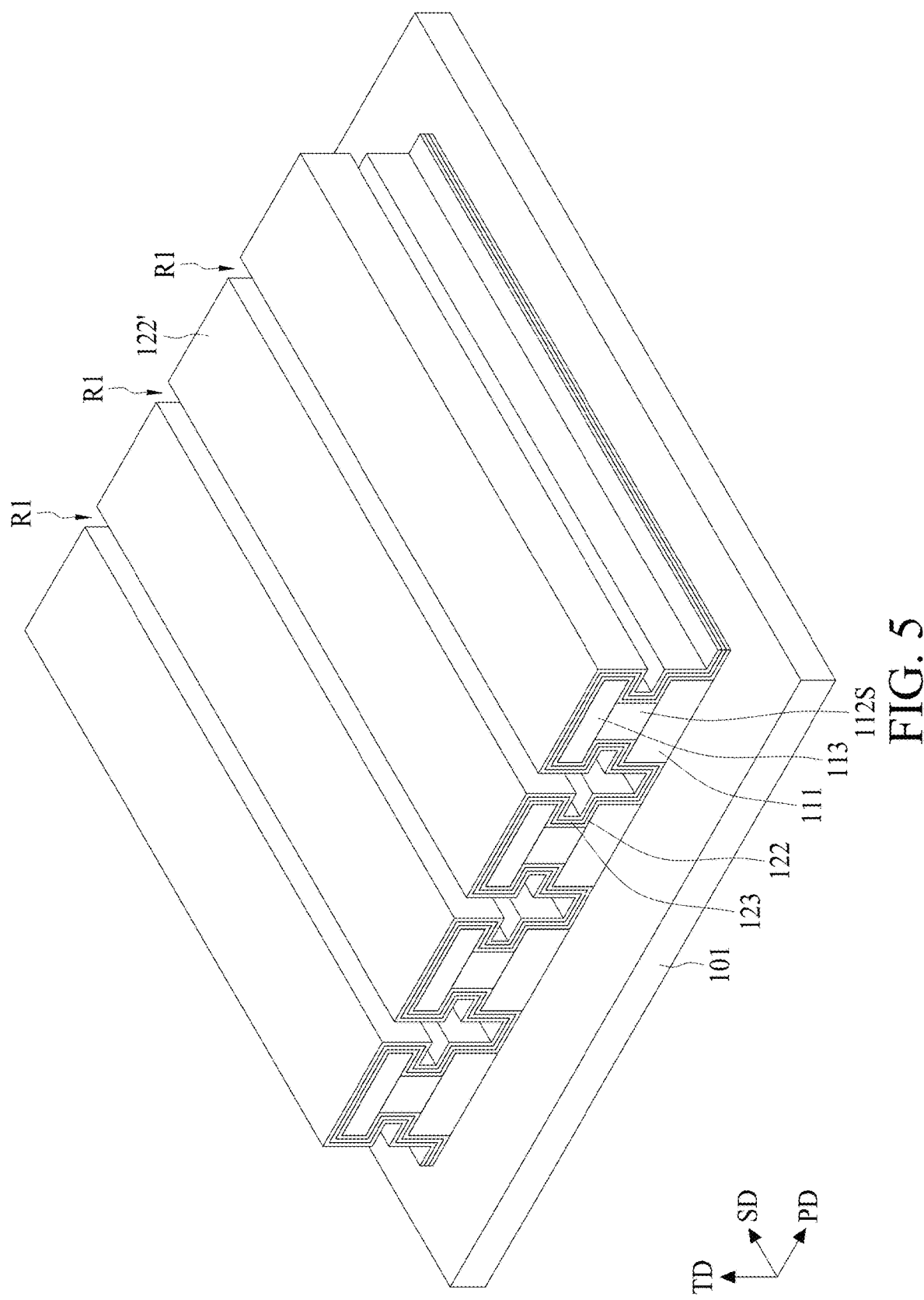

Referring to FIG. 5, FIG. 5 is a cross sectional view of a semiconductor structure during intermediate stages of manufacturing operations, according to some embodiments of the present disclosure. A first high-k material 122 is formed to conform to a profile of the first recesses R1. In some embodiments, the first high-k material 122 further covers a top surface of the second layer 113. In some of the embodiments, the first high-k material 122 may be in direct contact with the exposed portion of the substrate 101. The first high-k material 122 may include a material suitable for being utilized as a dipole layer, such as, for example, hafnium-zirconium oxide (HfZrO; e.g., $Hf_xZr_xO_y$, or the like), other hafnium-zirconium-based materials, or ferroelectric materials. The channel layer 123 is formed over the first high-k material 122, wherein the channel layer 123 conforms to the profile of the first high-k material 122 (as well as the profile of the first recesses R1).

The second high-k material 122' is formed over the channel layer 123, wherein the second high-k material 122' conforms to the profile of the channel layer 123 (and the profile of the first recesses R1). The second high-k material 122' may include a material different from the first high-k material 122, such as, for example, hafnium oxide (e.g., HfO) or other materials suitable for enhancing channel carrier performance. For example, HfO may provide oxide vacancy for enhancing channel carrier performance.

The profile of the first recesses R1 formed by the lateral pullback operation may facilitate the formation of the first high-k material 122, the channel layer 123, and the second high-k material 122' and may provide an adequate device channel area to improve device performance.

Figure 6:
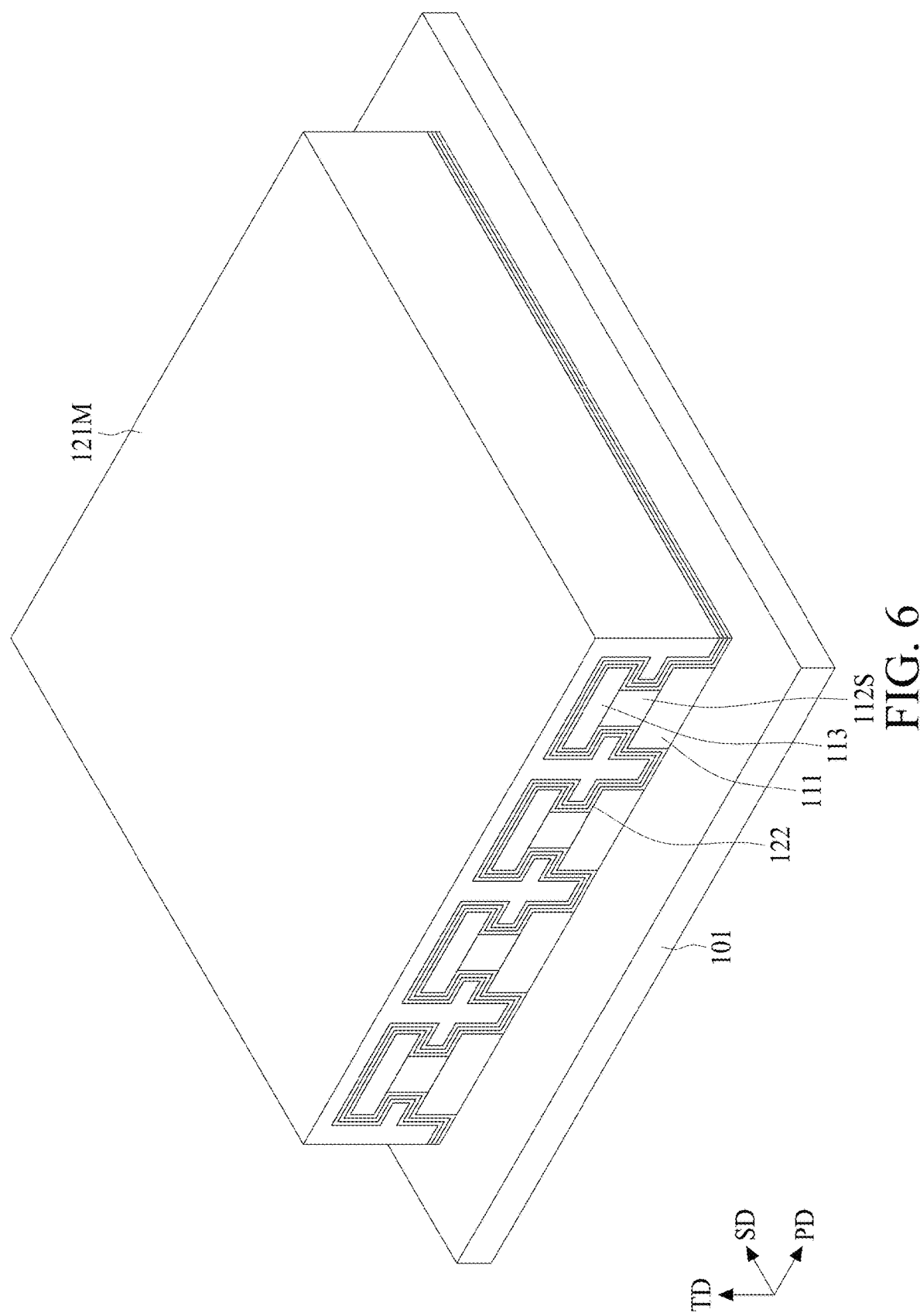

Referring to FIG. 6, FIG. 6 is a cross sectional view of a semiconductor structure during intermediate stages of manufacturing operations, according to some embodiments of the present disclosure. Gate material 121M is formed over the second high-k material 122' and in the first recesses R1 (as shown in FIG. 5). The gate material 121M may include conductive material, such as Tungsten (W) or the like.

Figure 7:
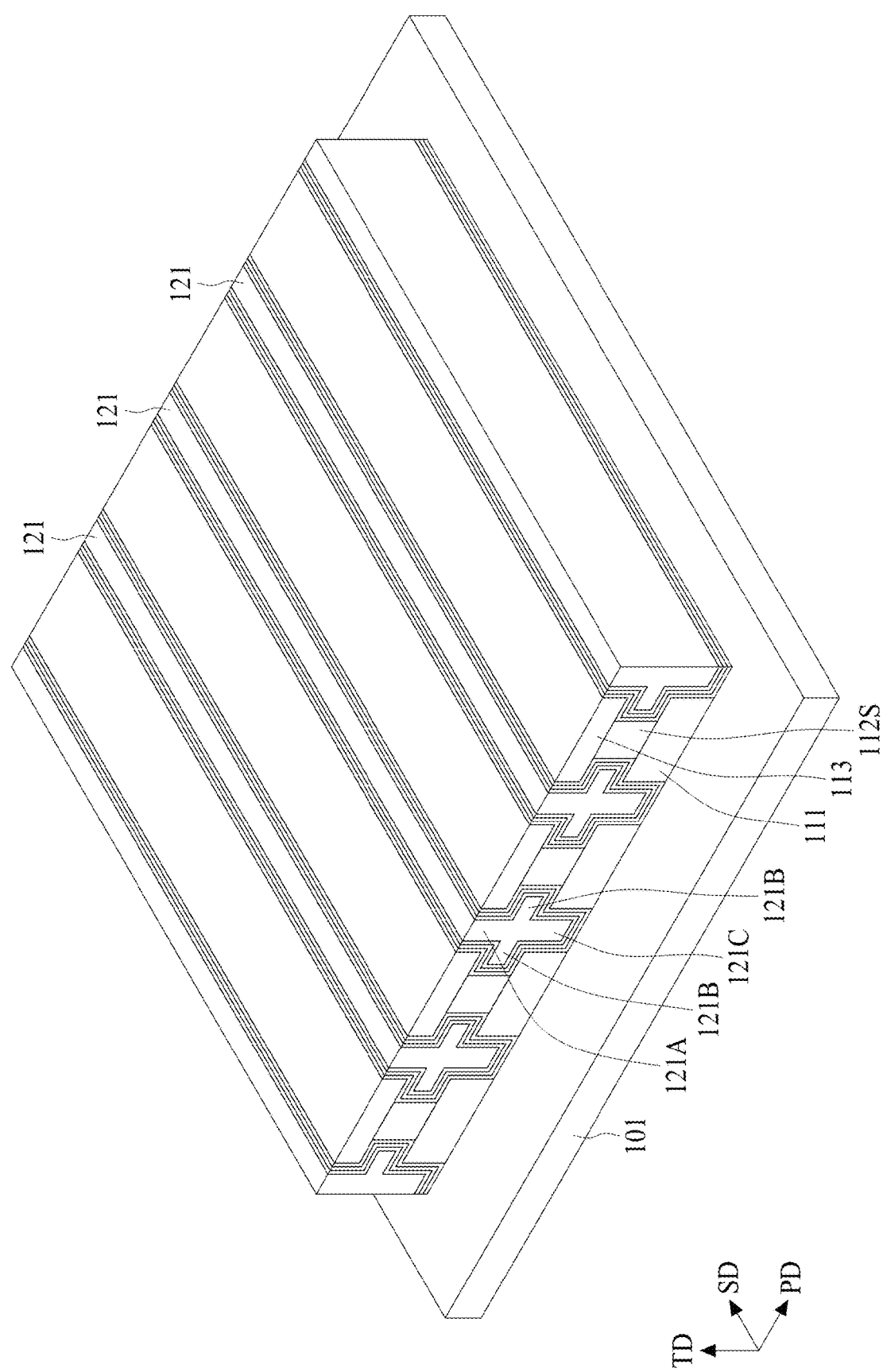

Referring to FIG. 7, FIG. 7 is a cross sectional view of a semiconductor structure during intermediate stages of manufacturing operations, according to some embodiments of the present disclosure. A planarization operation, such as a chemical mechanical planarization (CMP) operation, can be performed from a top surface of the gate material 121M to remove excessive portions of the gate material 121M, the first high-k material 122, the channel layer 123, and the second high-k material 122'. A top surface of the second layer 113 is exposed by the planarization operation and the remaining gate material 121M thereby forms the gate layers 121. A top surface of the gate layer 121, a top surface of the second layer 113, a top surface of the first high-k material 122, a top surface of the channel layer 123, and a top surface of the second high-k material 122' may be coplanar. As previously discussed in FIG. 1A to FIG. 1E, a gate layer 121 may have a cruciform/cross shape from a cross-sectional view, which includes a first portion 121A traversing the second layer 113, a second portion 121B extending between the first layer 111 and the second layer 113, and a third portion 121C in the first layer 111 and proximal to the substrate 101.

Figure 8:
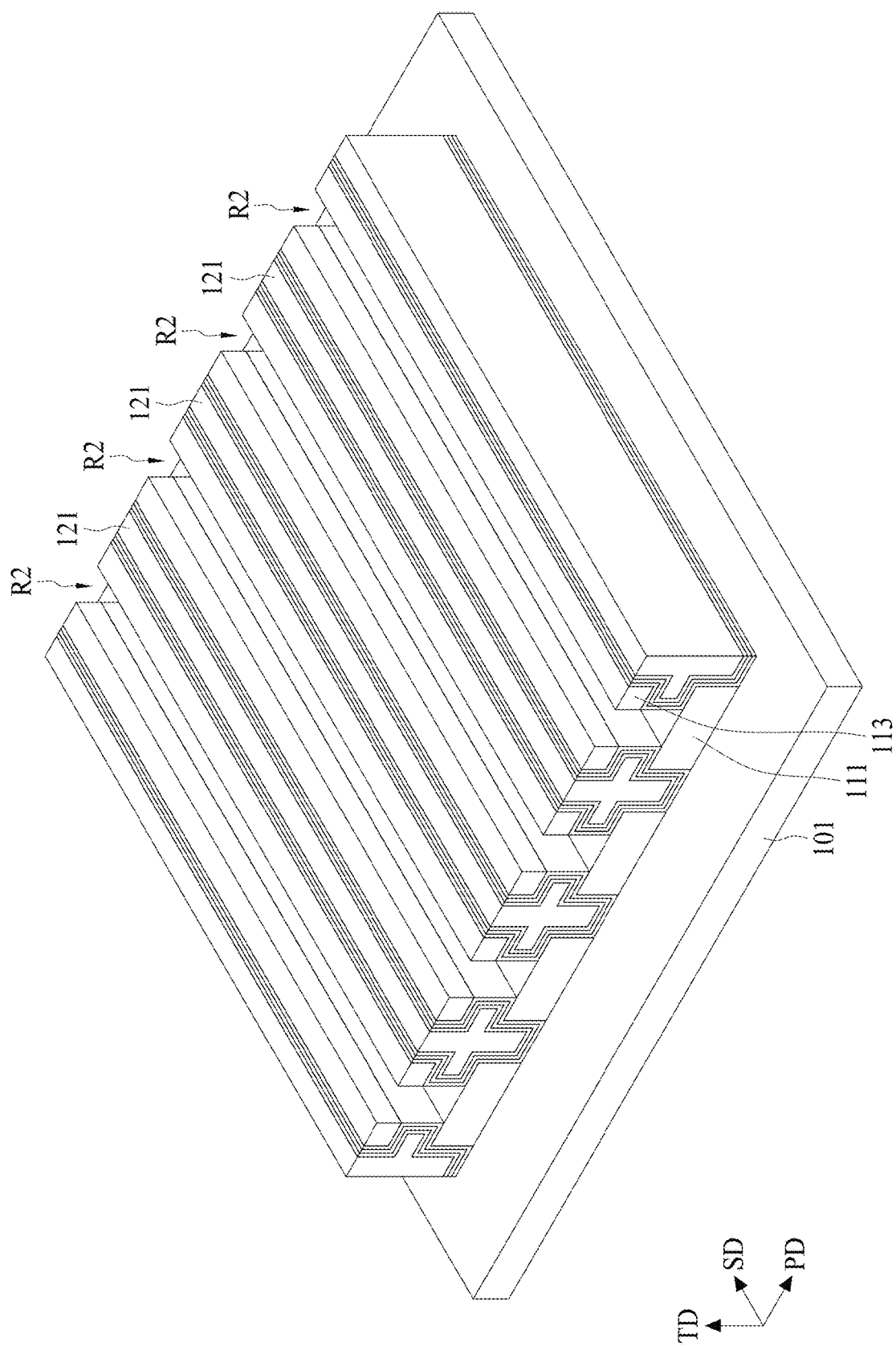

Referring to FIG. 8, FIG. 8 is a cross sectional view of a semiconductor structure during intermediate stages of manufacturing operations, according to some embodiments of the present disclosure. In some embodiments, the remaining sacrificial layer 112S and a portion of the second layer 113 above the remaining sacrificial layer 112S can be removed by etching operation, and a plurality of second recesses R2 may thereby be formed. In alternative embodiments, only one second recess R2 is formed. In some embodiments, the entire remaining sacrificial layer 112S is removed. In some embodiments, the etching operation may be controlled by a time calculation. In some embodiments, a portion of the first layer 111 may be etched from its top surface. In some alternative embodiments, a portion of the sacrificial layer 112S may remain.

Figure 9:
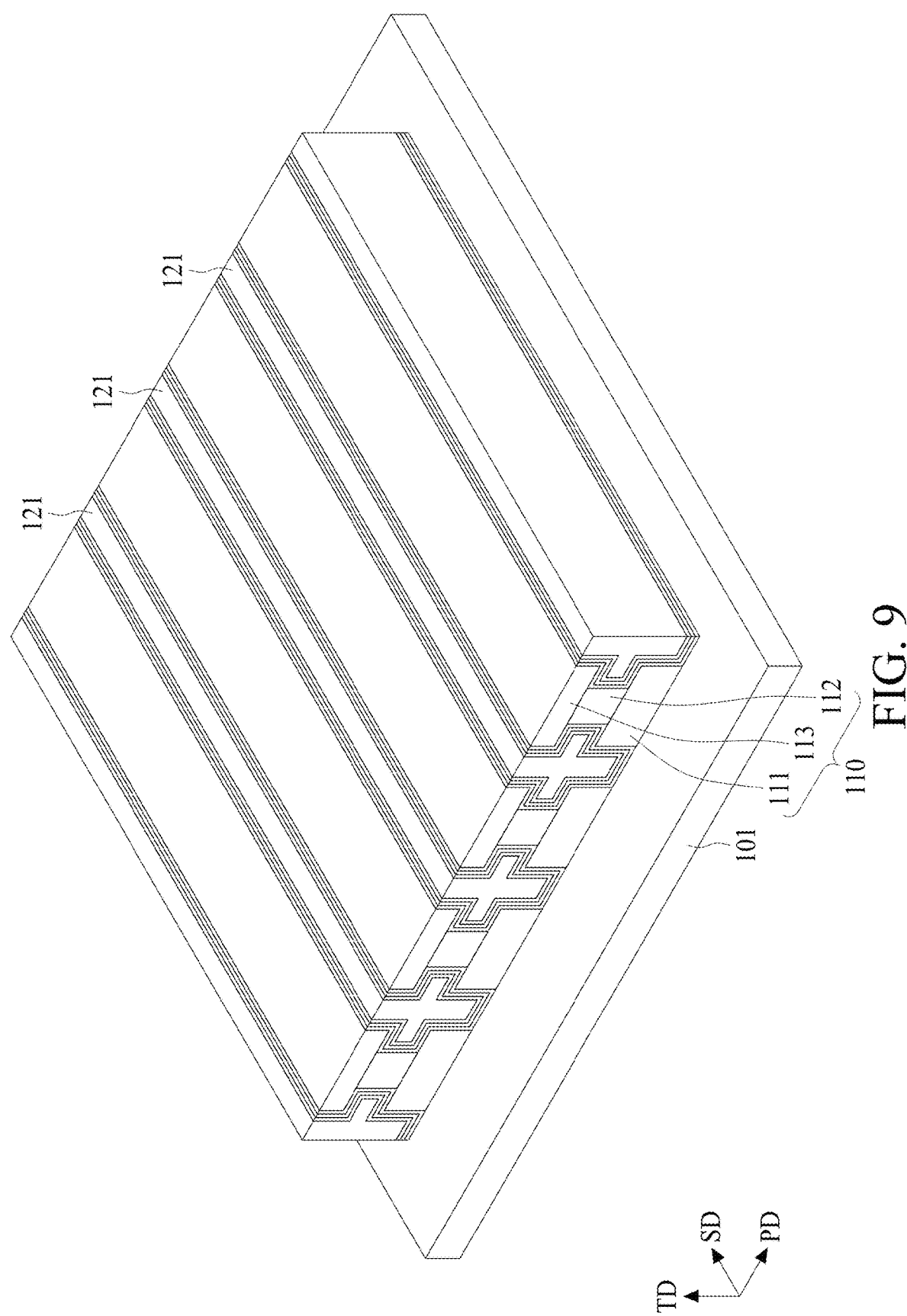

Referring to FIG. 9, FIG. 9 is a cross sectional view of a semiconductor structure during intermediate stages of manufacturing operations, according to some embodiments of the present disclosure. The material of the spacer layer 112 and/or the second layer 113 may be formed in the second recesses R2 (shown in FIG. 8). In some embodiments, as discussed in FIG. 1B, the spacer layer 112 and the second layer 113 above the second layer are formed in the second recesses R2. In some embodiments, a material of the spacer layer 112 may include oxide-based material. In some cases, the material of the spacer layer 112 may be similar or substantially identical to the material of the first layer 111 or the second layer 113. In some alternative embodiments, a material of the spacer layer 112 may be different from the first layer 111 and/or the second layer 113. For example, the material of the spacer layer 112 may include other oxide-based material, silicon nitride (SiN), silicon germanium (SiGe), or another insulation material/film material. In some embodiments, a planarization operation (such as CMP) can be performed to remove excess material.

In some alternative embodiments, referring to FIG. 1B', the material of the spacer layer 112 is identical to the material of the first layer 111 and the second layer 113, and such material is filled in the second recesses R2. In some embodiments, a planarization operation (such as CMP) can be performed to remove excess material.

In some alternative embodiments, referring to FIG. 1B", the material of the spacer layer 112 is different from the material of the first layer 111 and the second layer 113, and the spacer layer 112 is formed in the second recesses R2. In some cases, the material of the spacer layer 112 may be similar to the material of the first layer 111 or the second layer 113. In some alternative embodiments, a material of the spacer layer 112 may be different from the first layer 111 and/or the second layer 113. For example, the material of the spacer layer 112 may include another oxide-based material, silicon nitride (SiN), silicon germanium (SiGe), or some other insulation material/film material. In some embodiments, a planarization operation (such as CMP) can be performed to remove excess material and the spacer layer 112 may have a surface exposed and uncovered by the second layer 113.

By filling the second recesses R2, the first layer 111, the second layer 113, and the spacer layer 112 thereby constitute a dielectric stack 110.

Figure 10A:
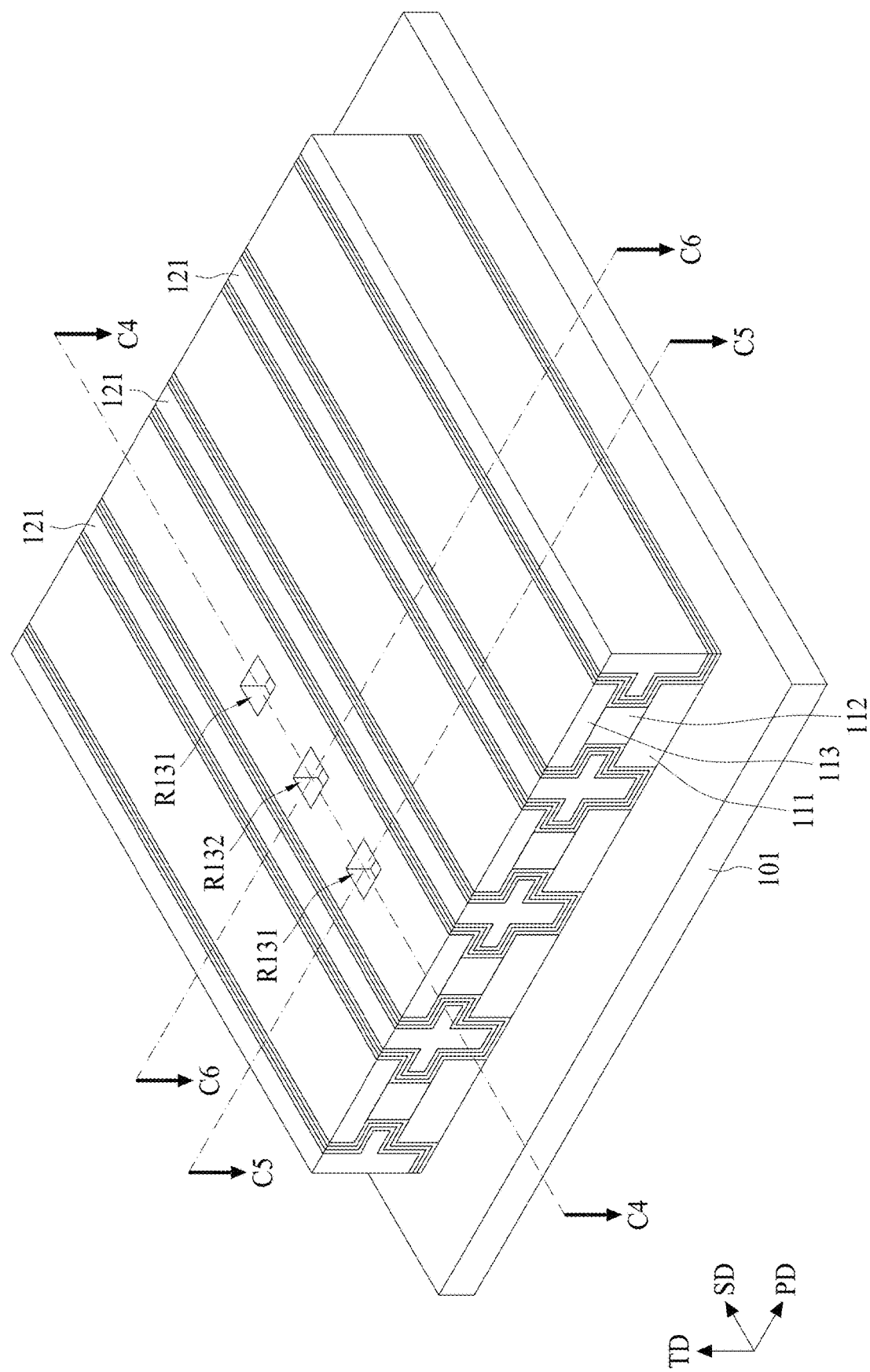
FIG. 10A is a schematic drawing illustrating a semiconductor structure during intermediate stages of manufacturing operations, according to some embodiments of the present disclosure.
Figure 10B:
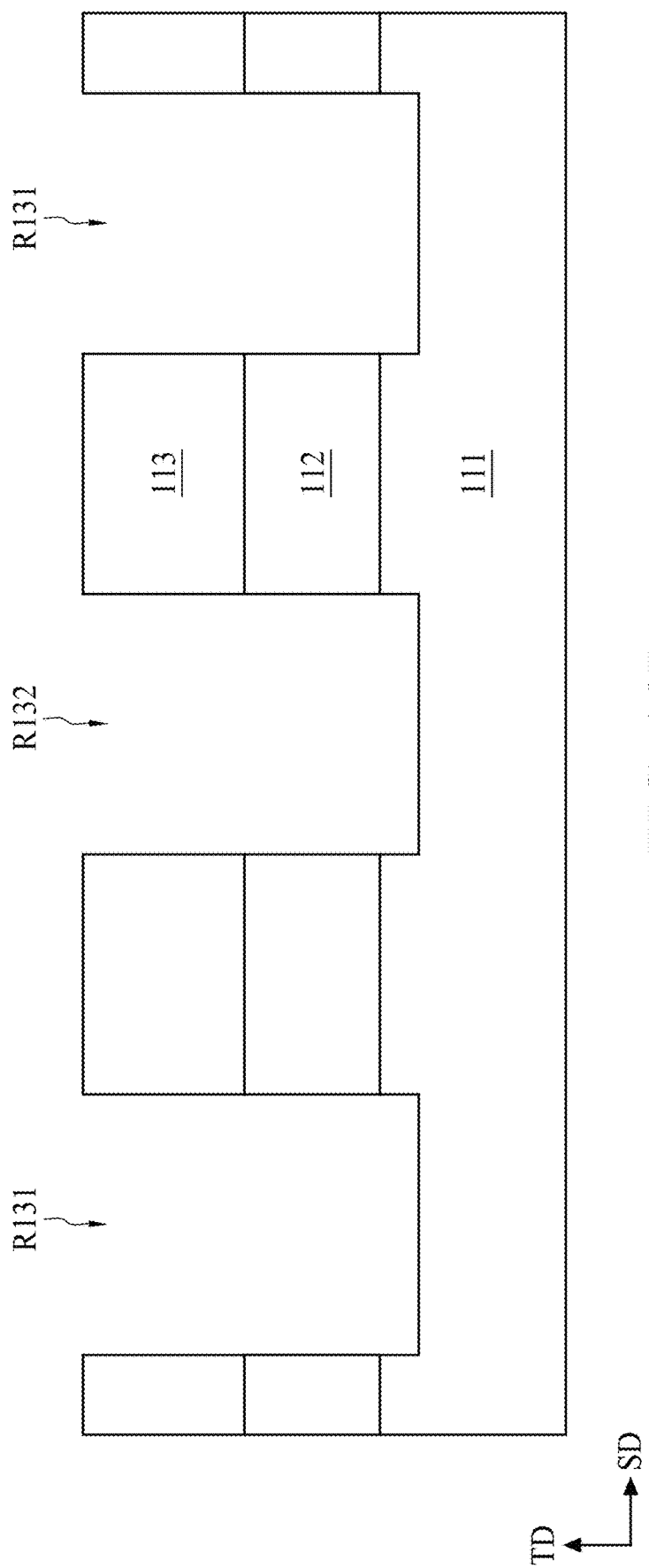
FIG. 10B illustrates a cross-sectional view of the reference cross-section C4-C4 of the semiconductor device of FIG. 10A, according to some embodiments of the present disclosure.
Figure 10C:
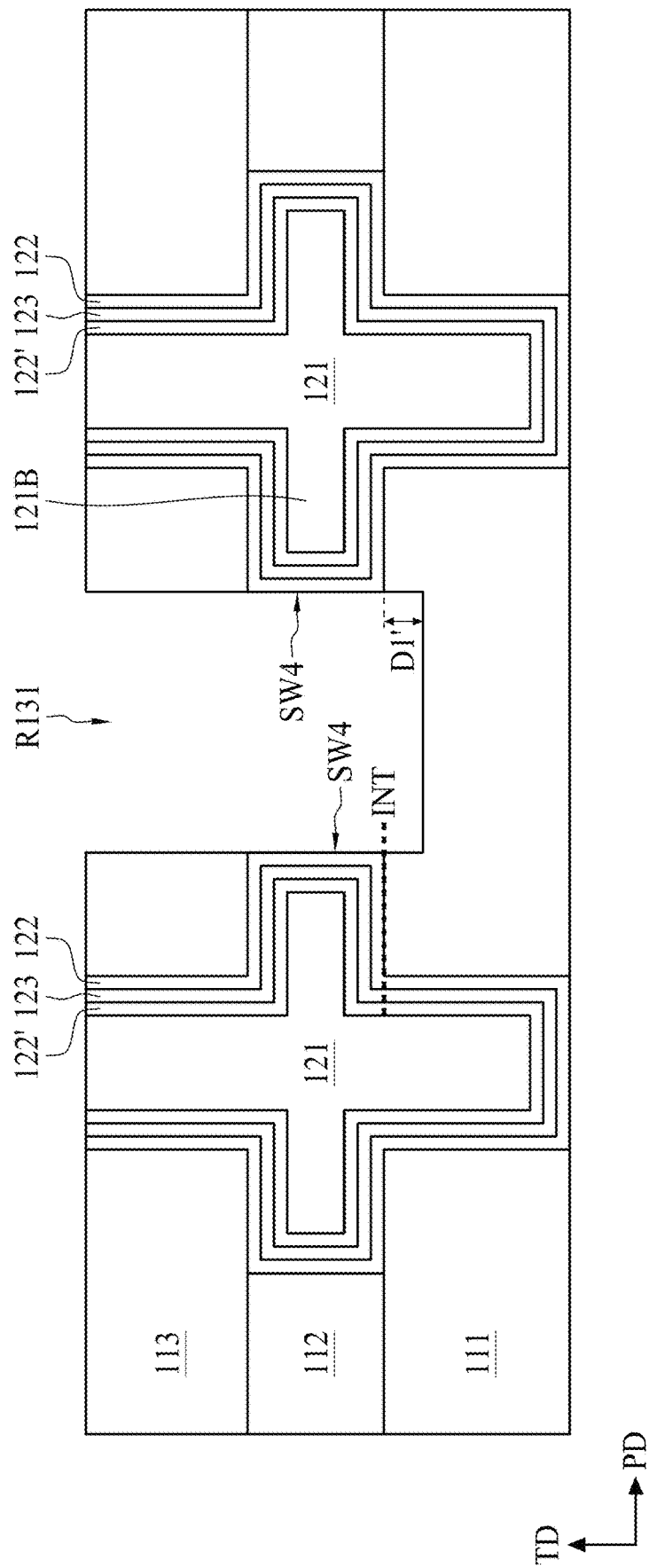
FIG. 10C illustrates a cross-sectional view of the reference cross-section C5-C5 of the semiconductor device of FIG. 10A, according to some embodiments of the present disclosure.
Figure 10D:
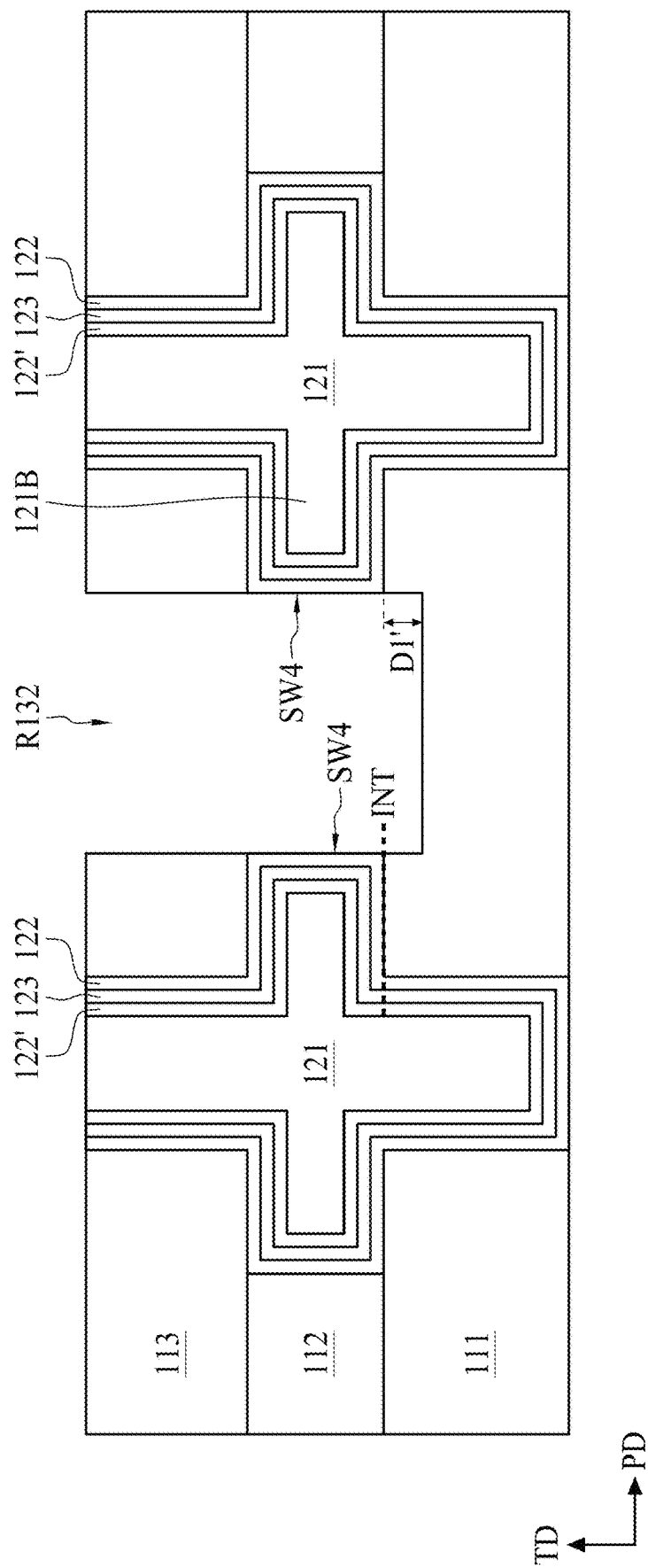
FIG. 10D illustrates a cross-sectional view of the reference cross-section C6-C6 of the semiconductor device of FIG. 10A, according to some embodiments of the present disclosure.

Referring to FIG. 10A, FIG. 10B, FIG. 10C, and FIG. 10D, FIG. 10A is a schematic drawing illustrating a semiconductor structure during intermediate stages of manufacturing operations, FIG. 10B illustrates a cross-sectional view of the reference cross-section C4-C4 of the semiconductor device of FIG. 10A, FIG. 10C illustrates a cross-sectional view of the reference cross-section C5-C5 of the semiconductor device of FIG. 10A, and FIG. 10D illustrates a cross-sectional view of the reference cross-section C6-C6 of the semiconductor device of FIG. 10A, according to some embodiments of the present disclosure. A plurality of third recesses R131 and a fourth recess R132 may be formed in the dielectric stack 110. In alternative embodiments, only one third recesses R131 is formed and a plurality of fourth recesses R132 are formed. In alternative embodiments, a plurality of third recesses R131 and a plurality of fourth recesses R132 are formed alternating in the secondary direction SD.

At least a portion of a sidewall SW4 of the first high-k material 122 (which may be proximal to the second portion 121B of the gate layer 121) is exposed from the third recesses R131 and the fourth recess R132. In some embodiments, the formation of the third recesses R131 and the fourth recess R132 may include photolithography operation and/or etching operation. The etching operation can be controlled by a time calculation. In some embodiments, the bottom surfaces of the third recesses R131 and the fourth recess R132 are at a level lower than a level of an interface INT between a top surface of the first layer 111 and the first high-k material 122 by a distance D1'. For example, the bottom surfaces of the third recesses R131 and the fourth recess R132 may be at a level below the top surface of the first layer 111 (or the interface INT) by a range from about 20 nm to about 30 nm.

Figure 11A:
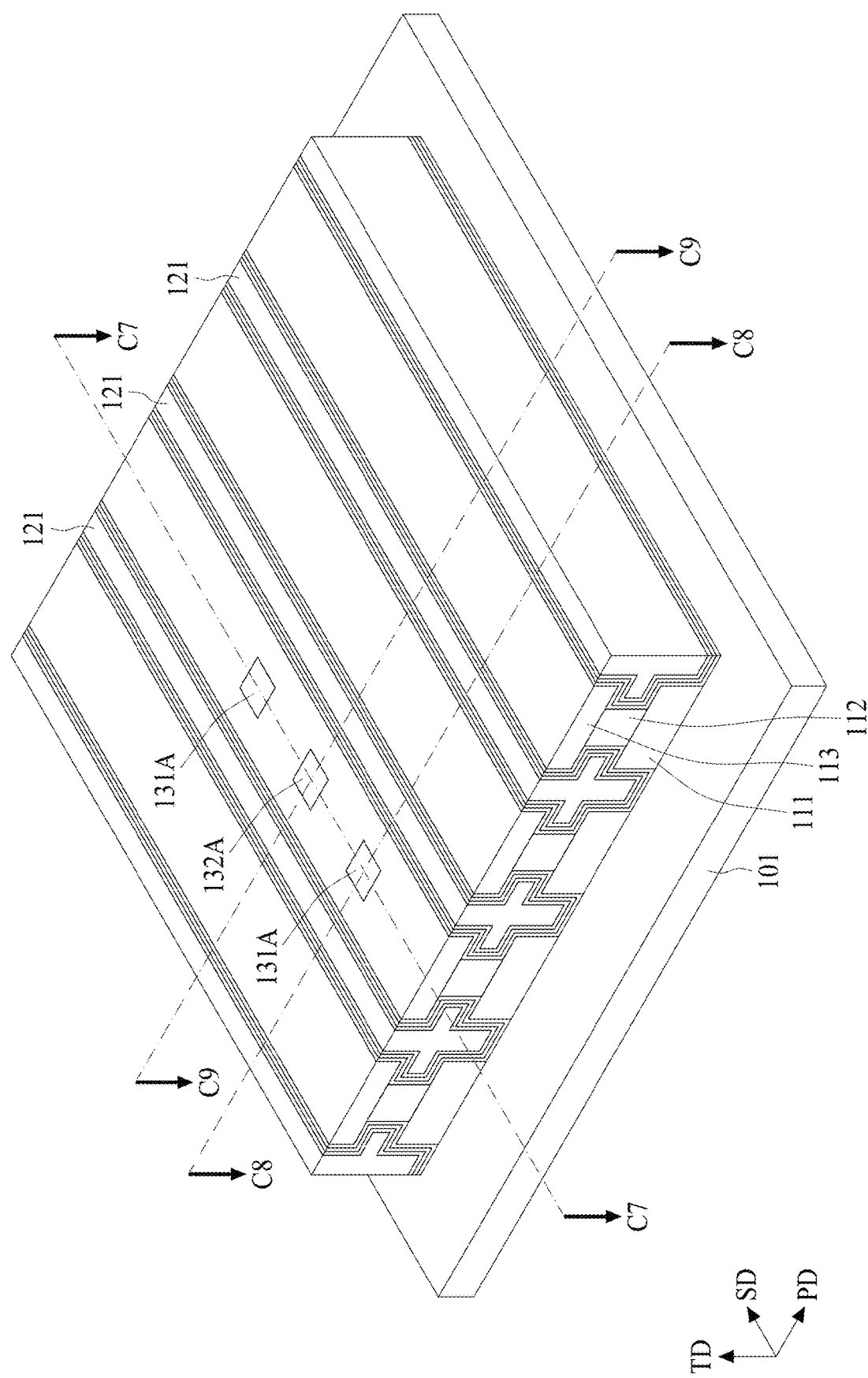
FIG. 11A is a schematic drawing illustrating a semiconductor structure during intermediate stages of manufacturing operations, according to some embodiments of the present disclosure.
Figure 11B:
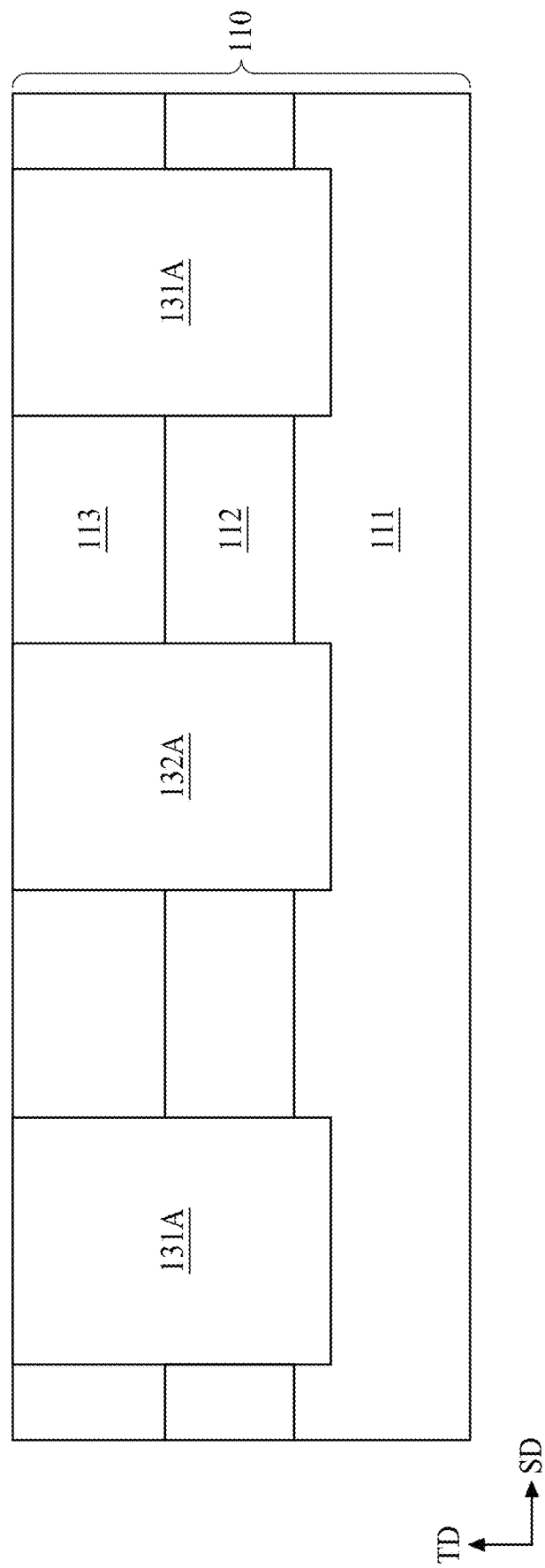
FIG. 11B illustrates a cross-sectional view of the reference cross-section C7-C7 of the semiconductor device of FIG. 11A, according to some embodiments of the present disclosure.
Figure 11C:
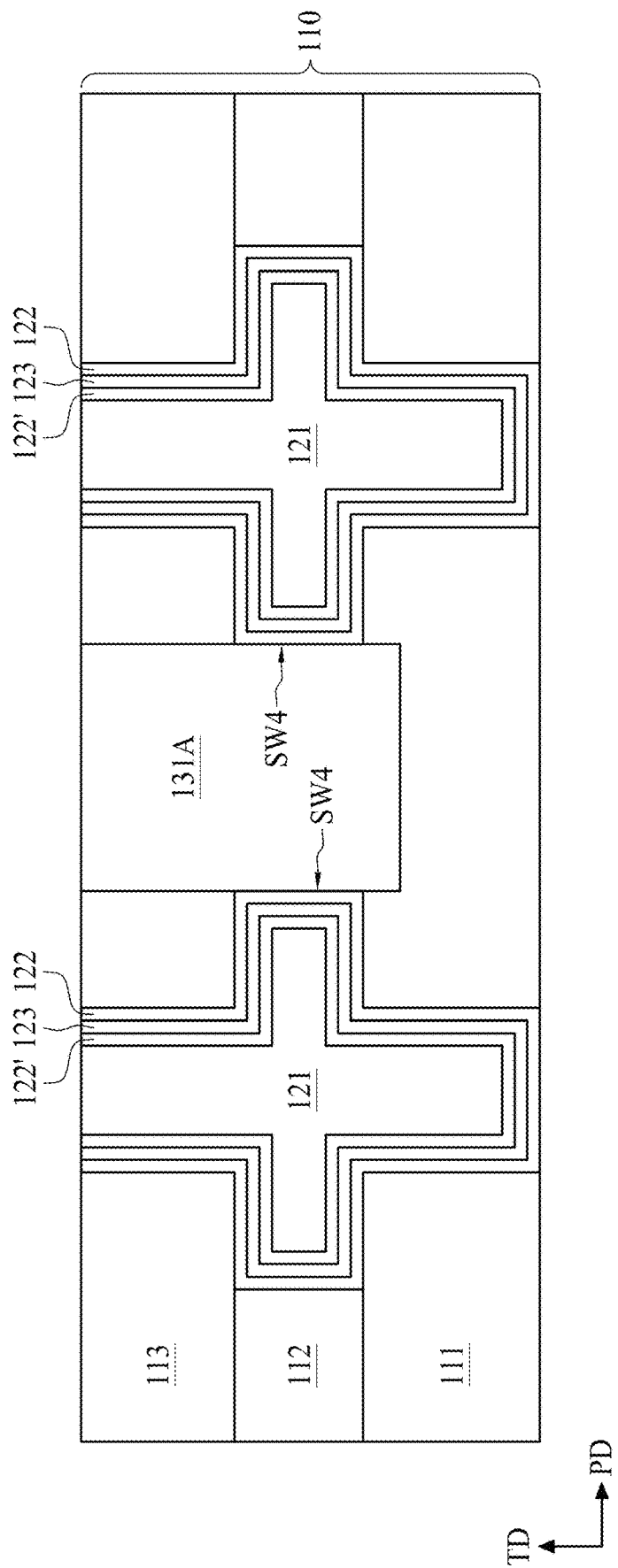
FIG. 11C illustrates a cross-sectional view of the reference cross-section C8-C8 of the semiconductor device of FIG. 11A, according to some embodiments of the present disclosure.
Figure 11D:
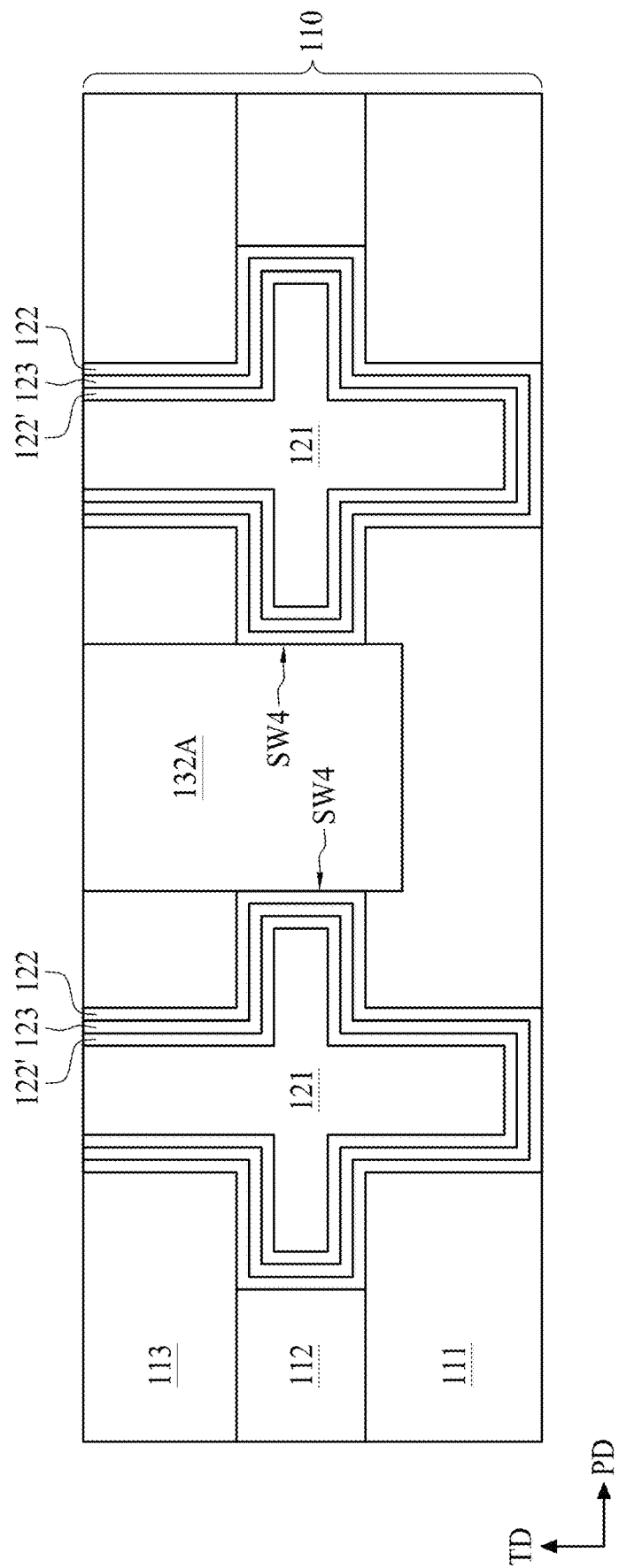
FIG. 11D illustrates a cross-sectional view of the reference cross-section C9-C9 of the semiconductor device of FIG. 11A, according to some embodiments of the present disclosure.

Referring to FIG. 11A, FIG. 11B, FIG. 11C, and FIG. 11D, FIG. 11A is a schematic drawing illustrating a semiconductor structure during intermediate stages of manufacturing operations, FIG. 11B illustrates a cross-sectional view of the reference cross-section C7-C7 of the semiconductor device of FIG. 11A, FIG. 11C illustrates a cross-sectional view of the reference cross-section C8-C8 of the semiconductor device of FIG. 11A, and FIG. 11D illustrates a cross-sectional view of the reference cross-section C9-C9 of the semiconductor device of FIG. 11A, according to some embodiments of the present disclosure. In some embodiments, the conductive features 131A and 132A may be respectively formed in the third recesses R131 and the fourth recess R132, wherein the conductive features 131A and 132A include conductive materials, such as tungsten (W) or the like. The conductive features 131A and 132A may be in direct contact with the first high-k material 122 (conforming to two adjacent gate layers 121) on two opposing sides at the sidewalls SW4 across from each other in the primary direction PD. In some embodiments, the conductive feature(s) 131A may constitute source layer and the conductive feature(s) 132A may constitute drain layer.

Figure 12:
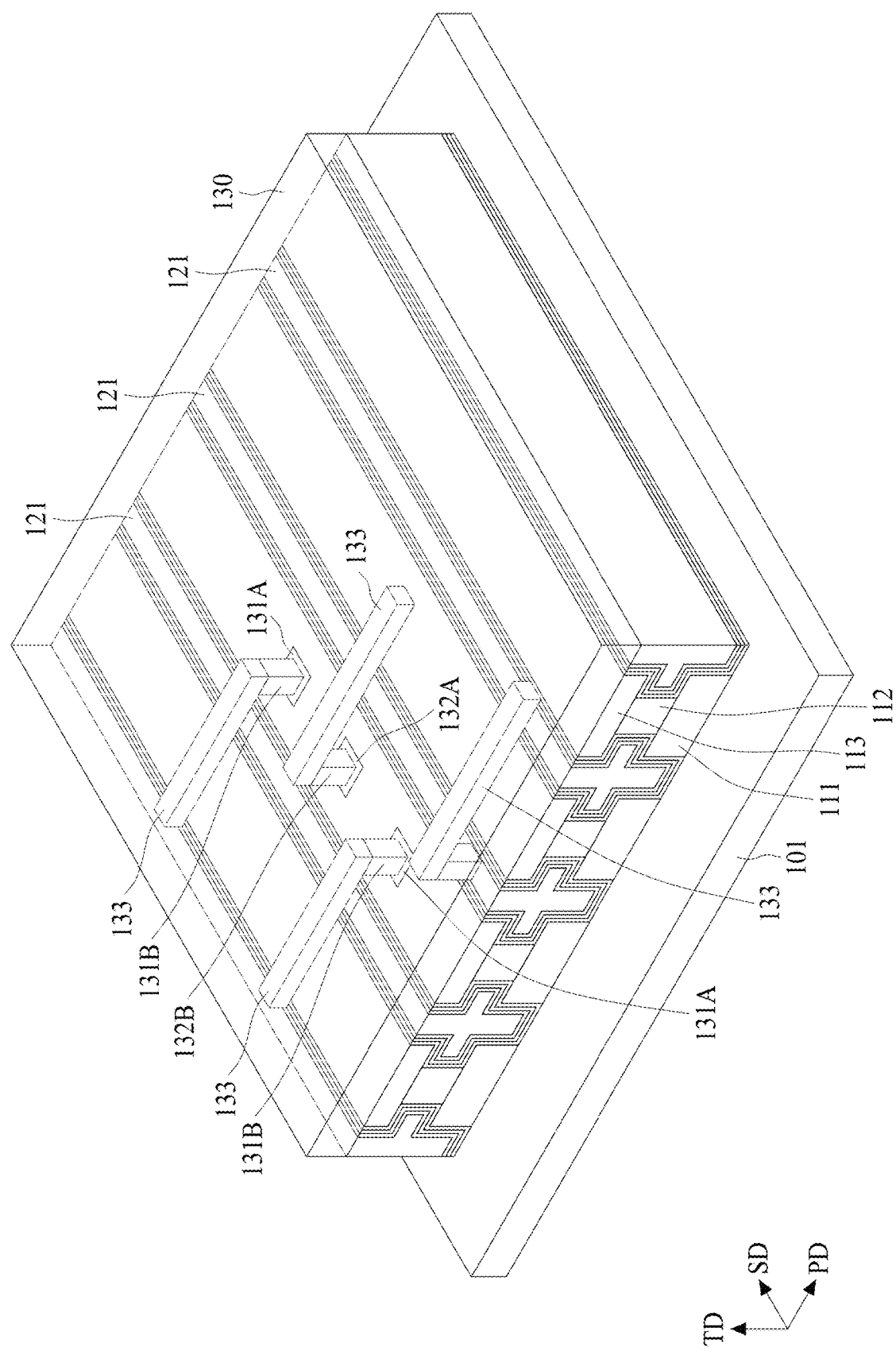
FIG. 12 is a schematic drawing illustrating a semiconductor structure during intermediate stages of manufacturing operations, according to some embodiments of the present disclosure.

Referring to FIG. 12, FIG. 12 is a schematic drawing illustrating a semiconductor structure during intermediate stages of manufacturing operations, according to some embodiments of the present disclosure. An insulation layer 130 is formed over the dielectric stack 110, and the interconnect structures formed in the dielectric stack 110. In some embodiments, the formation of the interconnect structure may include a photolithography operation and etching operation. The interconnect structures may include a first conductive via 131B electrically connected to each of the conductive feature 131A and a second conductive via 132B electrically connected to the conductive feature 132A. In some embodiments, the semiconductor device 100 further includes a conductive path 133 disposed in the insulation layer 130 and connected to the gate layer 121. In some embodiments, the conductive path 133 constitute a word line. The first conductive via 131B, the second conductive via 132B, and the conductive path 133 may include conductive material, such as copper.

The present disclosure provides semiconductor structures that can be utilized in memory device applications. Specifically, the present disclosure provides a gate layer 121 having a substantial cruciform/cross shape from a cross-sectional view (as shown in FIG. 1A to FIG. 1E and FIG. 12). As a result of the shape of the gate layer 121, the entire contact area between the high-k layers and the channel layer (as well as the contact area between the second high-k material 122' and the gate layer 121) are increased, and the entire device channel area can be increased, compared to comparative embodiments with an upright gate or curve-shaped gate. This leads to improved device performance, such as improved processing speed or reliability.

In addition, the aforementioned profile of the gate layer 121 (discussed in FIG. 1A to FIG. 12) can be formed by a simplified operation. In a comparative embodiment where the gate layer is formed prior to forming the high-k material, additional lithography operations may be employed to expose a portion of the gate layer in order to connect the gate layer to a word line. In some embodiments, the present disclosure may reduce the overall number of lithography operations (for example, reduced by two photomasks), thereby improving the throughput and fabrication efficiency.

Furthermore, the technique of the lateral pullback on the sacrificial layer 112S yields sidewalls of the sacrificial layer 112S having a vertical profile. Such sidewalls of the remaining sacrificial layer 112S are utilized for forming the high-k materials 122 and 122' prior to forming the gate layer 121. In some of the cases, an additional etch stop layer can be omitted, thus helping to achieve device size scale-down. Further, such a configuration enables formation of a recess for exposing a sidewall of the first high-k material 122 from the sacrificial layer 112S by using an etching operation.

Similar techniques as discussed in the present disclosure may be applied to various types of memory structures or other semiconductor structures, including but not limited to non-volatile memory devices, volatile memory devices, nanosheet devices, gate-all-around devices, nanowire devices, Fin Field-Effect Transistor (FinFET) structures, or other types of transistors.

Some embodiments of the present disclosure provide a semiconductor structure, including: a substrate; a dielectric stack over the substrate and including a first layer over the substrate and a second layer over the first layer; and a gate layer including a first portion traversing the second layer and a second portion extending between the first layer and the second layer.

Some embodiments of the present disclosure provide a semiconductor structure, including: a substrate; a dielectric stack over the substrate and including a first layer over the substrate and a second layer over the first layer; and a first high-k material in direct contact with a bottom surface of the second layer.

Some embodiments of the present disclosure provide a method for fabricating a semiconductor structure, including: forming a first layer over a substrate, wherein the first layer includes a first material; forming a sacrificial layer over the first layer, wherein the sacrificial layer comprises a second material different from the first material; forming a second layer over the sacrificial layer; forming a first recess to expose a sidewall of the sacrificial layer; and forming a gate material in the first recess.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a substrate;
   a dielectric stack over the substrate, the dielectric stack comprising:
      a first layer over the substrate; and
      a second layer over the first layer;
   a gate layer inset into the dielectric stack and comprising a first portion and a second portion, wherein the first portion extends through the second layer from top to bottom, and wherein the second portion extends laterally between the first layer and the second layer to both overlie the first layer and underlie the second layer; and
   a semiconductor channel layer conforming to a profile of the gate layer and wrapping around the second portion to separate the second portion from the dielectric stack.

2. The semiconductor structure of claim 1, wherein the semiconductor channel layer is on three different sides of the second portion.

3. The semiconductor structure of claim 1, further comprising a conductive feature extending through the second layer from top to bottom, wherein the second portion is laterally between and borders the conductive feature and the first portion.

4. The semiconductor structure of claim 3, wherein a bottom surface of the conductive feature is at a level lower than a level of a top surface of the first layer.

5. The semiconductor structure of claim 3, wherein the first layer extends laterally in a closed path to surround the conductive feature.

6. The semiconductor structure of claim 1, further comprising a first high-k material in direct contact with a bottom surface of the second layer and separating the second portion from the dielectric stack.

7. The semiconductor structure of claim 6, wherein the first high-k material comprises a sidewall connecting between the bottom surface of the second layer and a top surface of the first layer, and wherein an angle between the sidewall of the first high-k material and the bottom surface of the second layer is in a range from 80 degree to 90 degree.

8. A semiconductor structure, comprising:
   a substrate;
   a dielectric stack over the substrate, the dielectric stack comprising:
      a first layer over the substrate; and
      a second layer over the first layer;
   a gate layer extending through the dielectric stack from top to bottom and having a cross shaped profile;
   a first high-k material in direct contact with a bottom surface of the second layer and separating the gate layer from the dielectric stack; and
   a channel layer conforming to an inner sidewall of the first high-k material and separating the gate layer from the first high-k material.

9. The semiconductor structure of claim 8, wherein the first high-k material is in direct contact with a top surface of the first layer.

10. The semiconductor structure of claim 8, wherein the first high-k material comprises hafnium zirconium oxide or hafnium zirconium.

11. The semiconductor structure of claim 8, wherein the gate layer comprises a pair of protrusions, wherein the protrusions are respectively on opposite sides of the gate layer and protrude in opposite directions respectively to locations that both underlie the second layer and overlie the first layer.

12. The semiconductor structure of claim 11, further comprising:
   a second high-k material in direct contact with top and bottom surfaces of the protrusions, wherein a composition of the second high-k material is different from a composition of the first high-k material.

13. A semiconductor structure, comprising:
   a substrate;
   a dielectric stack over the substrate;
   a gate electrode extending into the dielectric stack from a top surface of the dielectric stack, wherein the gate electrode has a protrusion protruding laterally in a first direction from a sidewall of the gate electrode, and wherein the protrusion has a flat surface overlying a first portion of the dielectric stack and underlying a second portion of the dielectric stack;
   a multilayer film lining and conforming to the protrusion to separate the protrusion from the dielectric stack, wherein the multilayer film comprises a semiconductor layer; and
   a source electrode and a drain electrode spaced from each other in a second direction laterally transverse to the first direction;
   wherein the multilayer film is between the source electrode and the protrusion and is between the drain electrode and the protrusion.

14. The semiconductor structure according to claim 13, wherein the protrusion has a rectilinear cross-sectional profile.

15. The semiconductor structure according to claim 13, wherein the multilayer film comprises a first high k dielectric layer and a second high k dielectric layer, and wherein the semiconductor layer is between the first and second high k dielectric layers.

16. The semiconductor structure according to claim 15, wherein the first high k dielectric layer directly contacts the source electrode and the semiconductor layer, and wherein the second high k dielectric layer directly contacts the flat surface and the semiconductor layer.

17. The semiconductor structure according to claim 13, wherein the flat surface faces the source electrode and further faces the drain electrode.

18. The semiconductor structure according to claim 13, wherein the flat surface faces the first portion of the dielectric stack or the second portion of the dielectric stack.

19. The semiconductor structure according to claim 13, wherein the gate electrode has an additional protrusion protruding laterally in a third direction opposite the first direction from an additional sidewall of the gate electrode, and wherein the additional protrusion has a flat surface overlying a third portion of the dielectric stack and underlying a fourth portion of the dielectric stack.

20. The semiconductor structure of claim 8, further comprising:
   a second high-k material conforming to an inner sidewall of the channel layer and separating the gate layer from the channel layer.

* * * * *